US009570176B2

(12) United States Patent
Jung et al.

(10) Patent No.: US 9,570,176 B2
(45) Date of Patent: Feb. 14, 2017

(54) NONVOLATILE MEMORY DEVICE, STORAGE DEVICE HAVING THE SAME, OPERATING METHOD THEREOF

(71) Applicant: SAMSUNG ELECTRONICS CO., LTD., Suwon-si, Gyeonggi-do (KR)

(72) Inventors: Won-Taeck Jung, Suwon-Si (KR); Tae-Hong Kwon, Seoul (KR); Tae-Min Park, Seongnam-Si (KR); Ohsuk Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/668,544

(22) Filed: Mar. 25, 2015

(65) Prior Publication Data

US 2016/0118123 A1 Apr. 28, 2016

(30) Foreign Application Priority Data

Oct. 22, 2014 (KR) ......................... 10-2014-0143506

(51) Int. Cl.
| | | |
|---|---|---|
| *G11C 11/34* | (2006.01) | |
| *G11C 16/10* | (2006.01) | |
| *G11C 16/26* | (2006.01) | |
| *G11C 7/04* | (2006.01) | |
| *G11C 8/12* | (2006.01) | |
| *G11C 16/08* | (2006.01) | |

(52) U.S. Cl.
CPC ................. *G11C 16/10* (2013.01); *G11C 7/04* (2013.01); *G11C 8/12* (2013.01); *G11C 16/08* (2013.01); *G11C 16/26* (2013.01)

(58) Field of Classification Search
CPC ............................... G11C 16/10; G11C 16/26
USPC .......................... 365/185.11, 185.05, 185.18, 185.17, 365/185.23
See application file for complete search history.

(56) References Cited

U.S. PATENT DOCUMENTS

| | | | | |
|---|---|---|---|---|
| 6,295,227 | B1 * | 9/2001 | Sakui et al. ............. | 365/185.17 |
| 6,388,921 | B1 * | 5/2002 | Yamamoto ......... | G11C 16/0416 257/E21.69 |
| 6,731,540 | B2 * | 5/2004 | Lee et al. ................. | 365/185.17 |
| 7,403,427 | B2 * | 7/2008 | Chen ........................ | 365/185.29 |
| 7,672,170 | B2 | 3/2010 | Lee et al. | |
| 7,679,133 | B2 | 3/2010 | Son et al. | |
| 7,821,832 | B2 * | 10/2010 | Hahn ....................... | G11C 8/10 365/185.11 |

(Continued)

FOREIGN PATENT DOCUMENTS

| | | |
|---|---|---|
| JP | 2000048582 A | 2/2000 |
| JP | 3898349 B2 | 1/2007 |

(Continued)

*Primary Examiner* — Viet Q Nguyen
(74) *Attorney, Agent, or Firm* — Volentine & Whitt, PLLC

(57) ABSTRACT

An operating method of a nonvolatile memory device includes determining whether a memory block is a selected block, and when the memory block is not the selected block, determining whether the memory block shares a block word line with the selected block. The method further includes applying an unselected block word line voltage to word lines of the memory block when the memory block shares the block word line with the selected block, and floating the word lines of the memory block when the memory block does not share the block word line with the selected block.

12 Claims, 27 Drawing Sheets

(56) References Cited

U.S. PATENT DOCUMENTS

| | | | |
|---|---|---|---|
| 8,139,417 B2* | 3/2012 | Kim | G11C 16/04 |
| | | | 365/185.17 |
| 8,274,837 B2 | 9/2012 | Nakamura | |
| 8,339,856 B2* | 12/2012 | Iwata | 365/185.17 |
| 8,472,245 B2 | 6/2013 | Kim | |
| 8,553,466 B2 | 10/2013 | Han et al. | |
| 8,559,229 B2 | 10/2013 | Kim et al. | |
| 8,559,235 B2 | 10/2013 | Yoon et al. | |
| 8,654,587 B2 | 2/2014 | Yoon et al. | |
| 8,681,572 B2* | 3/2014 | Fontana | G11C 16/08 |
| | | | 365/189.11 |
| 8,693,248 B2* | 4/2014 | Kwon | G11C 16/12 |
| | | | 365/185.11 |
| 8,711,621 B2 | 4/2014 | Kim | |
| 8,953,376 B2* | 2/2015 | Nam et al. | 365/185.11 |
| 8,958,248 B2* | 2/2015 | Van Duuren | G11C 16/10 |
| | | | 365/185.17 |
| 8,971,115 B2* | 3/2015 | Hosono | G11C 16/24 |
| | | | 365/185.11 |
| 9,196,364 B2* | 11/2015 | Kim | G11C 16/08 |
| 2005/0018489 A1* | 1/2005 | Hosono | 365/185.29 |
| 2006/0268653 A1* | 11/2006 | Umezawa | G11C 8/10 |
| | | | 365/230.06 |
| 2007/0171727 A1* | 7/2007 | Choi | G11C 16/30 |
| | | | 365/185.23 |
| 2009/0244968 A1* | 10/2009 | Maejima | G11C 11/5628 |
| | | | 365/185.03 |
| 2009/0310405 A1* | 12/2009 | Lee et al. | 365/185.2 |
| 2009/0310414 A1* | 12/2009 | Lee | G11C 8/12 |
| | | | 365/185.17 |
| 2010/0165770 A1* | 7/2010 | Matsuoka | G11C 8/10 |
| | | | 365/207 |
| 2011/0157989 A1* | 6/2011 | Iwata | G11C 16/0483 |
| | | | 365/185.17 |
| 2011/0233648 A1 | 9/2011 | Seol et al. | |
| 2012/0147647 A1* | 6/2012 | Scheuerlein | G11C 13/0002 |
| | | | 365/51 |
| 2012/0221158 A1* | 8/2012 | Krok | H02J 3/00 |
| | | | 700/291 |
| 2012/0320678 A1* | 12/2012 | Maejima | G11C 16/0483 |
| | | | 365/185.11 |
| 2014/0043913 A1* | 2/2014 | Shiga | G11C 16/3436 |
| | | | 365/185.21 |
| 2014/0063938 A1 | 3/2014 | Oh et al. | |
| 2015/0003169 A1 | 1/2015 | Nam et al. | |
| 2015/0063027 A1* | 3/2015 | Hashimoto | G11C 16/26 |
| | | | 365/185.11 |
| 2015/0221376 A1* | 8/2015 | Choi | G11C 16/10 |
| | | | 365/185.11 |

FOREIGN PATENT DOCUMENTS

| | | |
|---|---|---|
| KR | 100850516 B1 | 7/2008 |
| KR | 1020110131648 A | 12/2011 |
| KR | 1020120079681 A | 7/2012 |
| KR | 1020140028957 A1 | 3/2014 |

* cited by examiner

NONVOLATILE MEMORY DEVICE, STORAGE DEVICE HAVING THE SAME, OPERATING METHOD THEREOF

CROSS-REFERENCE TO RELATED APPLICATIONS

A claim of priority under 35 U.S.C. §119 is made to Korean Patent Application No. 10-2014-0143506 filed Oct. 22, 2014, the entire contents of which are hereby incorporated by reference.

BACKGROUND

Embodiments of the inventive concepts described herein relate to a nonvolatile memory device, a storage device including the same, and an operating method thereof.

Semiconductor memory devices are generally classified as either volatile semiconductor memory devices which lose stored data in a power-off state, or nonvolatile semiconductor memory devices which retain stored data in a power-off state. In the case of nonvolatile semiconductor memory devices, the stored data may be permanent or reprogrammable, depending upon the fabrication technology used.

Nonvolatile semiconductor memory devices, such as flash memory devices, have been widely adopted as user data storage media and/or program/microcode storage media in a diverse array of applications in the computer, avionics, telecommunications, and consumer electronics industries.

SUMMARY

One aspect of embodiments of the inventive concept is directed to provide an operating method of a nonvolatile memory device. The operating method includes determining whether a memory block is a selected block; when the memory block is not the selected block, determining whether the memory block shares a block word line with the selected block; when the memory block is not the selected block and shares the block word line with the selected block, applying an unselected block word line voltage to word lines of the memory block; and when the memory block is not the selected block and does not share the block word line with the selected block, floating the word lines of the memory block.

The determination of whether the memory block is the selected block may be based on a row address.

The operating method may further include, when the memory block is the selected block, applying a selected word line voltage or an unselected word line voltage to the word lines of the memory block.

The applying of a selected word line voltage or an unselected word line voltage may include applying a program voltage as the selected word line voltage to be applied to a word line selected among the word lines of the memory block at a program operation; and applying a program pass voltage as the unselected word line voltage to be applied to unselected word lines among the word lines of the memory block at the program operation.

The applying of a selected word line voltage or an unselected word line voltage may include applying a read voltage or a verification read voltage as the selected word line voltage to be applied to a word line selected from the word lines of the memory block at a read operation or a verification read operation; and applying a read pass voltage as the unselected word line voltage to be applied to unselected word lines among the word lines of the memory block at the read operation or the verification read operation.

The applying of a selected word line voltage or an unselected word line voltage may include applying an erase word line voltage to the word lines of the memory block at an erase operation.

The applying of an unselected block word line voltage may include applying a ground voltage to at least one string selection line of the memory block at a program operation or a read operation of the selected block; applying the unselected block word line voltage to the word lines of the memory block at the program operation or the read operation; applying a dummy unselected block word line voltage to at least one dummy word line of the memory block at the program operation or the read operation; and applying the ground voltage to at least one ground selected line of the memory block at the program operation or the read operation.

The applying of an unselected block word line voltage may include floating the word lines of the memory block during an erase execution period of an erase operation of the selected block; applying the unselected block word line voltage to the word lines of the memory block during an erase verification operation, applying a ground voltage to at least on string selection line of the memory block during the erase verification operation; applying a dummy unselected block word line voltage to at least one dummy word line of the memory block during the erase verification operation; and applying the ground voltage to at least one ground selected line of the memory block during the erase verification operation.

The memory block may store programmed data.

The unselected block word line voltage may inhibit a negative boosting that is generated when a floating voltage of the word lines of the memory block drops.

The unselected block word line voltage may vary with zones of the word lines of the memory block.

The unselected block word line voltage to be applied to the word lines of the memory block may vary with a temperature of the memory block.

Another aspect of embodiments of the inventive concept is directed to provide an operating method of a storage device which includes at least one nonvolatile memory device and a memory controller to control the at least one nonvolatile memory device. The operating method includes predicting a degree of a threshold voltage shift of an unselected memory block at an operation of a selected block; setting a word line biasing about the unselected block; and performing the operation of the selected block while biasing a word line of the unselected block according to the set word line biasing.

The degree of a threshold voltage shift may be predicted based on at least one of a read count, a program elapsed time, and a program/erase (PE) cycle of the unselected block.

The unselected block may share a block word line with the selected block, and wherein the block word line is activated in response to a block address.

The operating method may further include generating word line voltages.

The operating method may further include applying a selected word line voltage or a first unselected word line voltage among the word line voltages to source lines connected to word lines of the selected block; and applying a second unselected word line voltage among the word line voltages to source lines connected to word lines of the unselected block.

The word line biasing of the unselected block may be set differently according to word line zones.

The word line biasing of the unselected block may be set differently according to a temperature.

A nonvolatile memory device is provided which includes a first block, a second block, first pass transistors, second pass transistors, a block word line, a block address decoder, a first source driver, a second source driver, and a word line voltage generating circuit. The first pass transistors connect first source lines to word lines of the first block, and the second pass transistors connect second source lines to word lines of the second block. The block word line is connected in common to gates of the first and second pass transistors, and the block address decoder activates the block word line in response to a block address. The first source driver is connected to the first source lines, and the second source driver is connected to the second source lines. The word line voltage generating circuit generates word line voltages. The source driver applies an unselected block word line voltage of the word line voltages to the first source lines when the second block is a selected block and the first block is an unselected block.

The first and second blocks may be implemented to have a floating body structure.

The first source driver may apply corresponding voltages of the word line voltages to the first source lines in response to a row address including the block address. The second source driver may apply corresponding voltages of the word line voltages to the second source lines in response to the row address.

Word lines of at least one other block that does not share the block word line may be floated when an operation of the second block is performed.

The word line voltage generating circuit may include a selected voltage generator configured to generate a word line selected voltage to be applied to word lines of the second block; a first unselected voltage generator configured to generate a first unselected word line voltage to be applied to the word lines of the second block; and a second unselected voltage generator configured to generate a second unselected word line voltage to be applied to word lines of the first block, wherein the second unselected word line voltage is the unselected block word line voltage.

The first unselected voltage generator may include first unselected word line zone voltage generators configured to generate first unselected word line voltages corresponding to first word line zones, and the second unselected voltage generator may include second unselected word line zone voltage generators configured generate to second unselected word line voltages corresponding to second word line zones.

The nonvolatile memory device may further include a temperature sensor configured to sense a temperature of at least one of the first and second block. The word line voltage generating circuit may include a high-temperature unselected word line voltage generator configured to generate the unselected word line voltage for a high temperature when a value of the temperature is greater than or equal to a predetermined value; and a low-temperature unselected word line voltage generator configured to generate the unselected word line voltage for a low temperature when a value of the temperature is smaller than the predetermined value.

A storage device is provided which includes at least one nonvolatile memory device and a memory controller configured to control the at least one nonvolatile memory device. The at least one nonvolatile memory device includes first blocks configured to share a first block word line; second blocks configured to share a second block word line; and control logic configured to set a word line biasing about at least one unselected block of the first and second blocks according to a row address when a selected block among the first blocks or the second blocks operates.

The word line biasing about the unselected block of the at least one nonvolatile memory device may be set in response to a request of the memory controller.

The word line biasing may be set according to a host request.

An operating method of a nonvolatile memory device is provided which includes sensing a temperature; generating a selected word line voltage, a first unselected word line voltage, and a second unselected word line voltage, based on the sensed temperature; applying the selected word line voltage or the first unselected word line voltage to word lines of a selected block; and applying the second unselected word line voltage to word lines of at least one unselected block.

BRIEF DESCRIPTION OF THE FIGURES

The above and other objects and features will become apparent from the detailed description that follows with reference to the accompanying figures, wherein like reference numerals refer to like parts throughout the various figures unless otherwise specified, and wherein.

DETAILED DESCRIPTION

Figure 1:
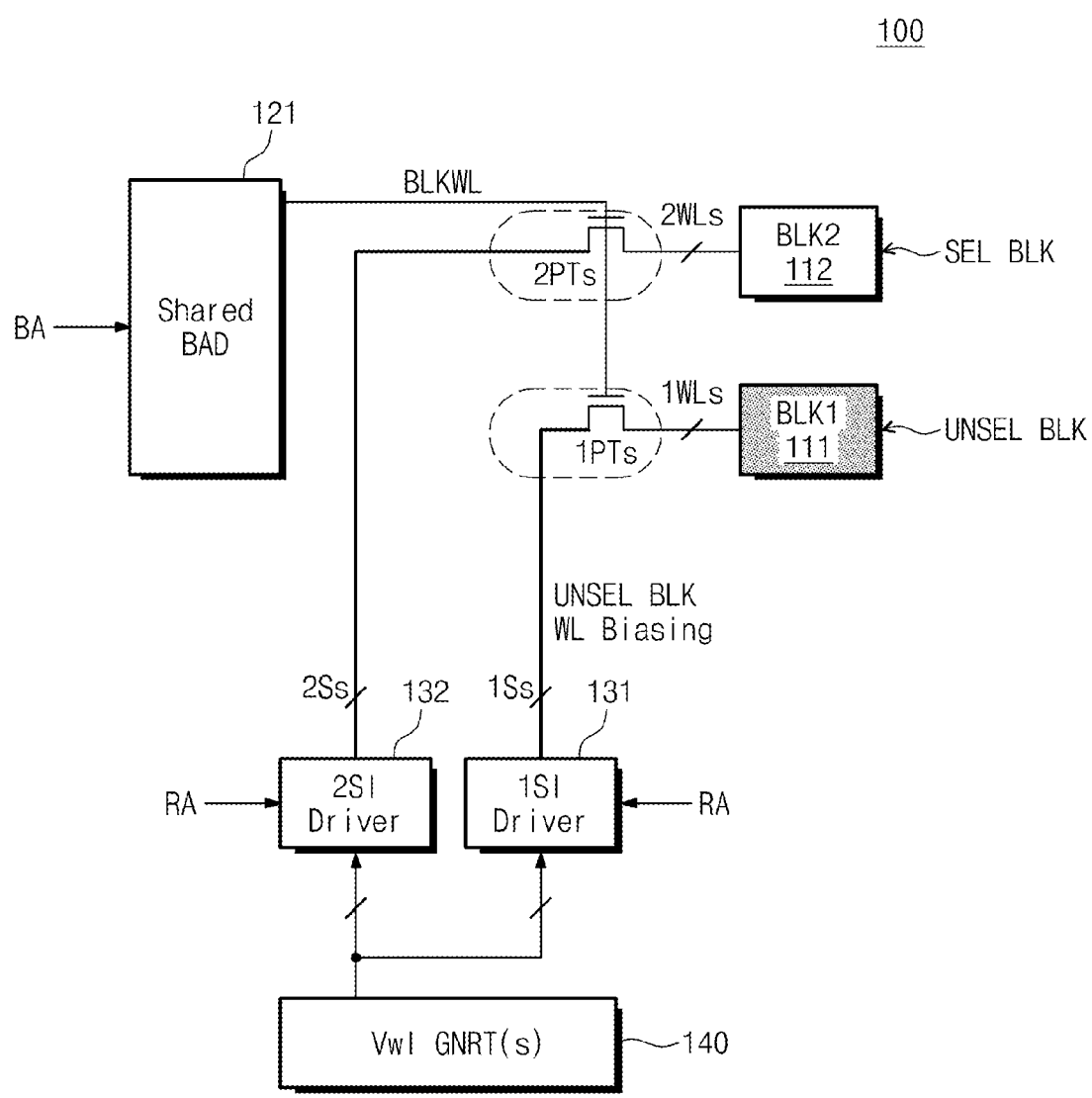
FIG. 1 is a block diagram schematically illustrating a nonvolatile memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory device according to an embodiment of the inventive concept. Referring to FIG. 1, a nonvolatile memory device 100 contains first and second memory blocks 111 and 112 (BLK1 and BLK2), first and second pass transistors 1PTs and 2PTs, a shared block address decoder 121 (Shared BAD), first and second source line drivers 131 and 132 (1SI Driver and 2SI Driver), and a word line voltage generating circuit 140 (Vwl GNRT(s)).

Non-limiting examples of nonvolatile memory device 100 include a NAND flash memory device, a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, or a Spin Transfer Torque Random Access Memory (STT-RAM) device. Also, as described next, the nonvolatile memory device 100 may be implemented to have a three-dimensional array structure.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate.

The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

As mentioned above, the inventive concept is not limited by memory technology. For example, the inventive concept is applicable to a Charge Trap Flash (CTF) memory device, in which a charge storage layer is made up of an insulation film, as well as a flash memory device, in which a charge storage layer is made up of a conductive floating gate. For purposes of illustration, it is assumed below that the nonvolatile memory device 100 is a vertical NAND flash memory device (VNAND).

Each of the memory blocks 111 and 112 may include a plurality of memory cells that are connected to word lines 1WLs and 2WLs, respectively. Each memory cell may store one or more bits. Each of the blocks 111 and 112 may be implemented to have a floating body structure.

The shared block address decoder 121 turns on the first and second pass transistors 1PTs and 2PTs in response to a block address BA. In exemplary embodiments, the shared block address decoder 121 may include high-voltage switches.

The first and second pass transistors 1PTs and 2PTs connect source lines 1Ss and 2Ss to the word lines 1WLs and 2WLs in response to a voltage of a block word line BLKWL as illustrated in FIG. 1. In exemplary embodiments, each of the first and second pass transistors 1PTs and 2PTs may be implemented with a high-voltage transistor.

The first source line driver 131 receives word line voltages and applies first voltages, corresponding to a row address RA, from among the input word line voltages to the first source lines 1Ss. When the first block 111 is a selected block, the first voltages may include a selected word line voltage and at least one unselected word line voltage. In contrast, when the first block 111 is an unselected memory block, the first voltages may include the at least one unselected word line voltage. In exemplary embodiments, the row address RA may include a block address BA.

The second source line driver 132 receives the word line voltages and applies second voltages, corresponding to the row address RA, from among the input word line voltages to the second source lines 2Ss. When the second block 112 is a selected block, the second voltages may include the selected word line voltage and the at least one unselected word line voltage. In contrast, when the first block 111 is an unselected block, the second voltages may include the at least one unselected word line voltage.

For example, in FIG. 1, an embodiment of the inventive concept is exemplified as the first block 111 is an unselected memory block and the second block 112 corresponding to the row address RA is a selected memory block. In this case, the first source line driver 131 applies unselected block word line voltages to be applied to the first word lines 1WLs of the unselected block 111 to the first source lines 1Ss connected to the first pass transistors 1PTs. The second source line driver 132 applies a selected word line voltage and unselected block word line voltages to be applied to the second word lines 2WLs of the selected block 112 to the second source lines 2Ss connected to the second pass transistors 2PTs.

The embodiment of the inventive concept as exemplified in FIG. 1 illustrates the first source line driver 131 and the second source line driver 132 as being separate. However, the scope and spirit of the inventive concept is not limited thereto. For example, the first source line driver 131 and the second source line driver 132 may be implemented in the form of a common source line driver. That is, the common source line driver may be implemented to provide the first and second source lines 1Ss and 2Ss with unselected voltages and a selected voltage, corresponding to a row address RA, from among the word line voltages.

The word line voltage generating circuit 140 generates word line voltages for driving operations under a control of control logic (not shown in FIG. 1). The word line voltages may include a selected word line voltage and a first unselected word line voltage(s), which will be applied to a selected block, and a second unselected word line voltage(s) (or, unselected block word line voltages) which will be applied to an unselected block.

Examples of the selected word line voltage include a program voltage, a read voltage, a read verification voltage, an erase word line voltage, and an erase verification voltage. Examples of the first unselected word line voltage(s) include a program pass voltage and a read pass voltage. An example of the second unselected word line voltage(s) includes a negative boosting prevention voltage. In exemplary embodiments, the term "negative boosting" may be used to indicate that charges of a channel suffer "negative coupling" when a word line voltage is sharply changed from a positive voltage to a negative voltage. Negative boosting is disclosed in U.S. patent application Ser. No. 14/242,332 (published as U.S. Patent Publication No. 2015/0003169), the entire contents of which are hereby incorporated by reference.

The nonvolatile memory device 100 according to an embodiment of the inventive concept carries out unselected block word line biasing to word lines (e.g., 1WLs) of an unselected block, to thereby prevent or mitigate the effects of negative boosting. As a result, impairment of the integrity of data of the unselected block is avoided during access of the selected block.

Figure 2:
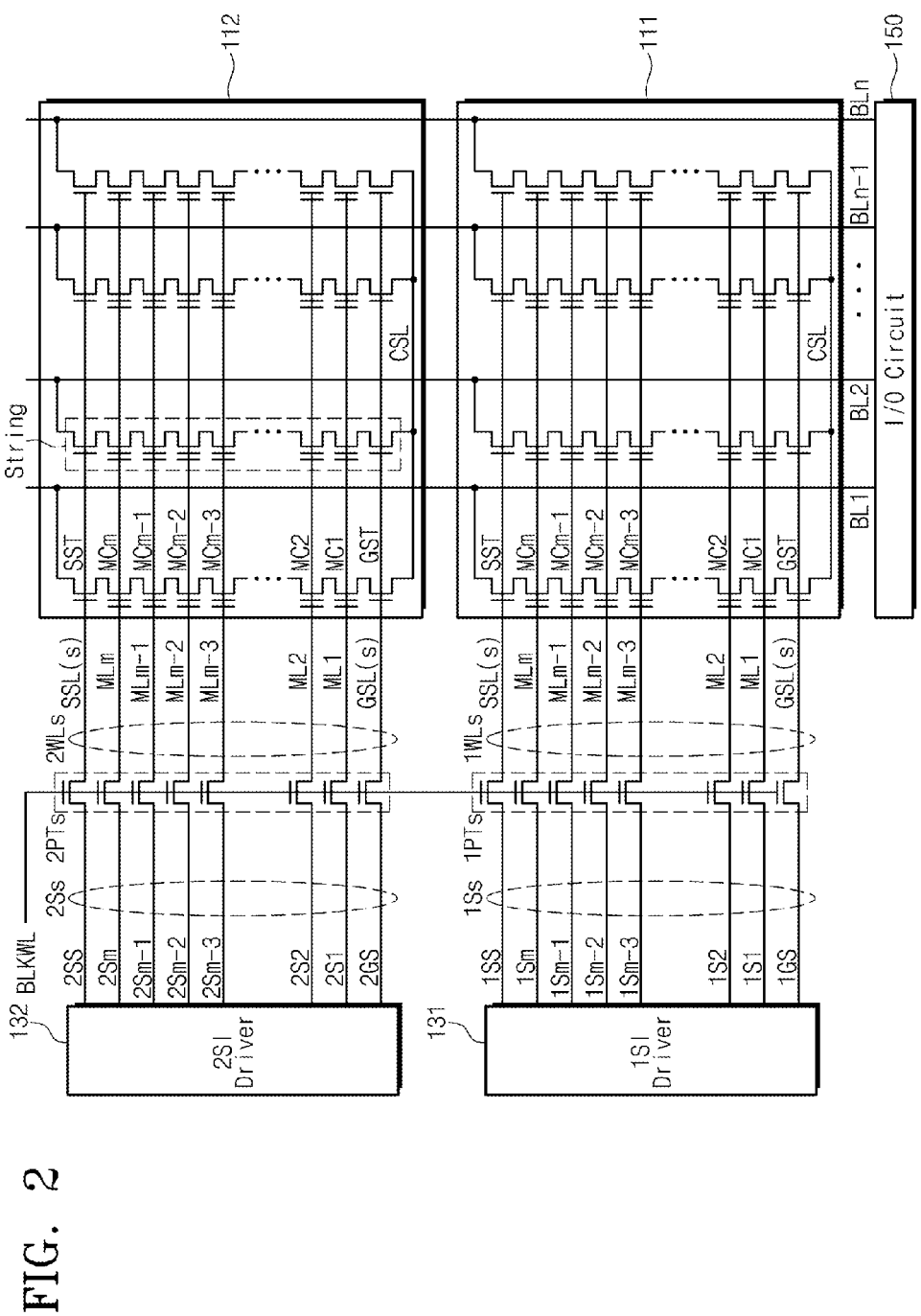
FIG. 2 is a circuit diagram showing examples of first and second blocks shown in FIG. 1.

FIG. 2 is a circuit diagram showing examples of the first and second blocks 111 and 112 shown in FIG. 1. Referring to FIG. 2, each of first and second blocks 111 and 112 contains strings that are connected to a plurality of bit lines BL1 through BLn (n being an integer of 2 or more). Each of the strings includes at least one string selection transistor SST, a plurality of memory cells MC1 through MCm (m being an integer of 2 or more), and at least one ground selected transistor GST that are connected in series between a bit line and a common source line CSL. In each string, each of the memory cells MC1 through MCm stores one or more data bits. Although not shown in figures, each string may further include at least one dummy cell disposed between the string selection transistor SST and the memory cells MC1 through MCm and at least one dummy cell disposed between the memory cells MC1 through MCm and the ground selected transistor GST.

As illustrated in FIG. 2, an input/output circuit 150 is provided which may include a plurality of page buffers (not shown) connected to the bit lines BL1 through BLn, respectively. Each page buffer may include a plurality of latches (not shown) that temporarily store data to be stored at a program operation or data to be read at a read/verification operation.

First source lines 1Ss (1SS, 1S1 through 1Sm, 1GS) connected to a first source line driver 131 are connected to at least one string selection line SSL(s), word lines 1WLs (WL1 through WLm), and at least one ground selected line GSL(s) through first pass transistors 1PTs, respectively. Second source lines 2Ss (2SS, 2S1 through 2Sm, 2GS) connected to a second source line driver 132 are connected to at least one string selection line SSL(s), word lines 2WLs (WL1 through WLm), and at least one ground selected line GSL(s) through second pass transistors 2PTs, respectively. Gates of the first and second pass transistors 1PTs and 2PTs are connected to a block word line BLKWL.

Next, a block having a floating body structure is exemplarily described.

Figure 3:
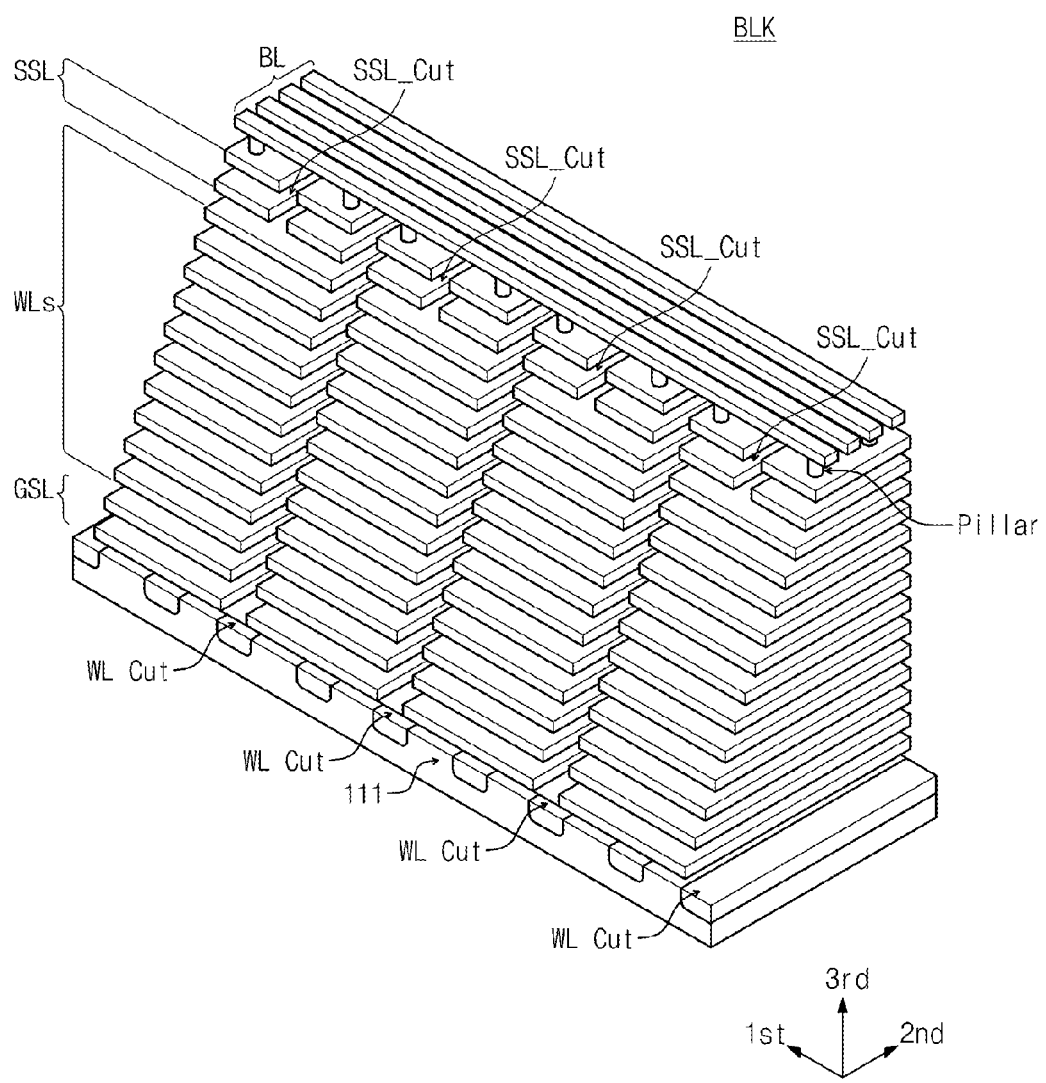
FIG. 3 is a perspective view of a memory block according to an embodiment of the inventive concept.

FIG. 3 is a perspective view of a memory block BLK according to an embodiment of the inventive concept. Referring to FIG. 3, four sub blocks are formed on a substrate. The sub blocks are formed by stacking and cutting at least one ground selected line GSL, a plurality of word lines, and at least one string selection line SSL on the substrate in a plate shape. The at least one string selection line SSL is separated by string selection line cuts.

A block BLK shown in FIG. 3 includes by way of example string cuts SSL_Cut for separating string selection lines. However, the scope and spirit of the inventive concept is not limited thereto. The block BLK may be implemented to have a structure in which a plurality of string selection lines are formed without a string cut SSL_Cut.

In exemplary embodiments, at least one plate-shaped dummy word line may be formed between the ground selected line GSL and the word lines. Alternatively, at least one plate-shaped dummy word line may be formed between the word lines and the string selection line SSL.

Each word line cut, although not shown in FIG. 3, may include a common source line CSL. In exemplary embodiments, the common source lines CSL included in the word line cuts may be interconnected. A string may be formed by making a pillar connected to a bit line penetrate the at least one string selection line SSL, the word lines, and the at least one ground selected line GSL.

In FIG. 3, an embodiment of the inventive concept is exemplified as a structure in which a sub block is positioned between adjacent word line cuts. However, the scope and spirit of the inventive concept is not limited thereto. For example, a structure between a word line cut and a string selection line cut may be defined as a sub block.

The memory block BLK according to an embodiment of the inventive concept may be implemented to have a merged word line structure in which two word lines are merged to one.

Figure 4:
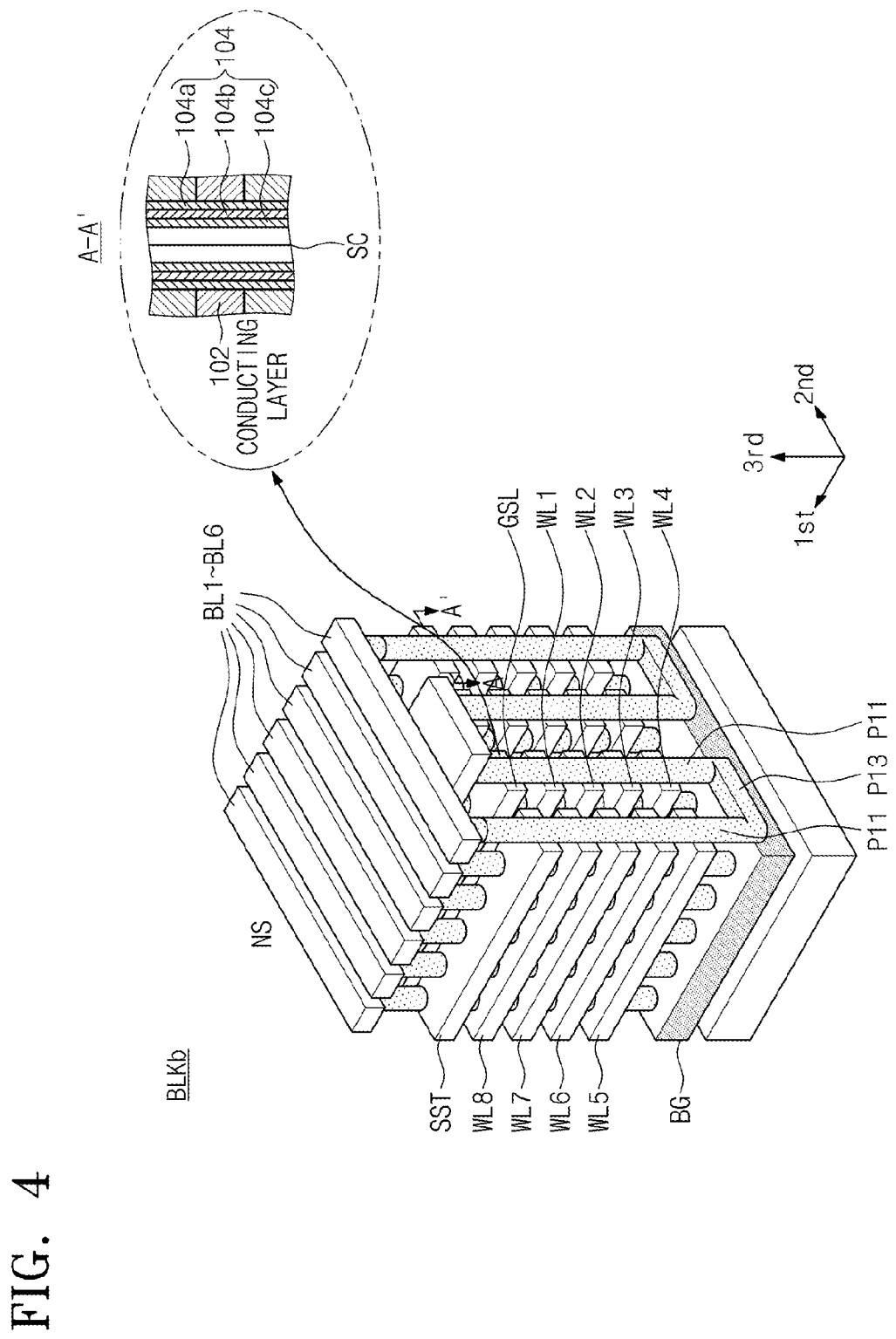
FIG. 4 is a perspective view of a block according to another embodiment of the inventive concept.

FIG. 4 is a perspective view of a block according to another embodiment of the inventive concept. For simplicity of description, it is illustrated that the number of word line layers is 4. Referring to FIG. 4, a memory block BLKb may be implemented to have a PBiCS (pipe-shaped bit cost scalable) structure in which lower ends of adjacent memory cells connected in series are connected through pipes. A memory block contains m-by-n strings NS (n and m being a natural number).

In the example of FIG. 4, m=6 and n=2. Each string NS contains memory cells MC1 through MC8 that are connected in series. First upper ends of the memory cells MC1 through MC8 are connected to string selection transistors SST, second upper ends thereof are connected to ground selected transistors GST, and lower ends thereof are connected through pipes.

In each string NS, memory cells are formed to be stacked on a plurality of semiconductor layers. Each string NS contains a first pillar P11, a second pillar P12, and a pillar connection portion P13 connecting the first and second pillars P11 and P12. The first pillar P11 is connected to a bit line (e.g., BL1) and the pillar connection portion P13, and is formed to penetrate a string selection line SSL and word lines WL5 through WL8. The second pillar P12 is connected to a common source line CSL and the pillar connection portion P13, and is formed to penetrate a ground selected line GSL and word lines WL1 through WL4. As illustrated in FIG. 4, each string NS is formed with a U-shaped pillar.

In exemplary embodiments, a back-gate BG is formed on a substrate, and the pillar connection portion P13 is embedded in the back-gate BG. In exemplary embodiments, the back-gate BG may be used in common in the block BLK. The back-gate BG may be separated from a back-gate of another block.

Referring back to FIG. 1, it is noted that the embodiment of the inventive concept illustrated there contains a shared block address decoder 121 that is shared by two blocks 111 and 122. However, the scope and spirit of the inventive concept is not limited thereto. For example, a shared block address decoder may be shared by three or more blocks.

Also, it is noted that source lines (e.g., 1Ss and 2Ss) according to an embodiment of the inventive concept may be shared by a plurality of blocks. In this case, as described next, an unselected block may be divided into an activated unselected block and an inactivated unselected block.

Figure 5:
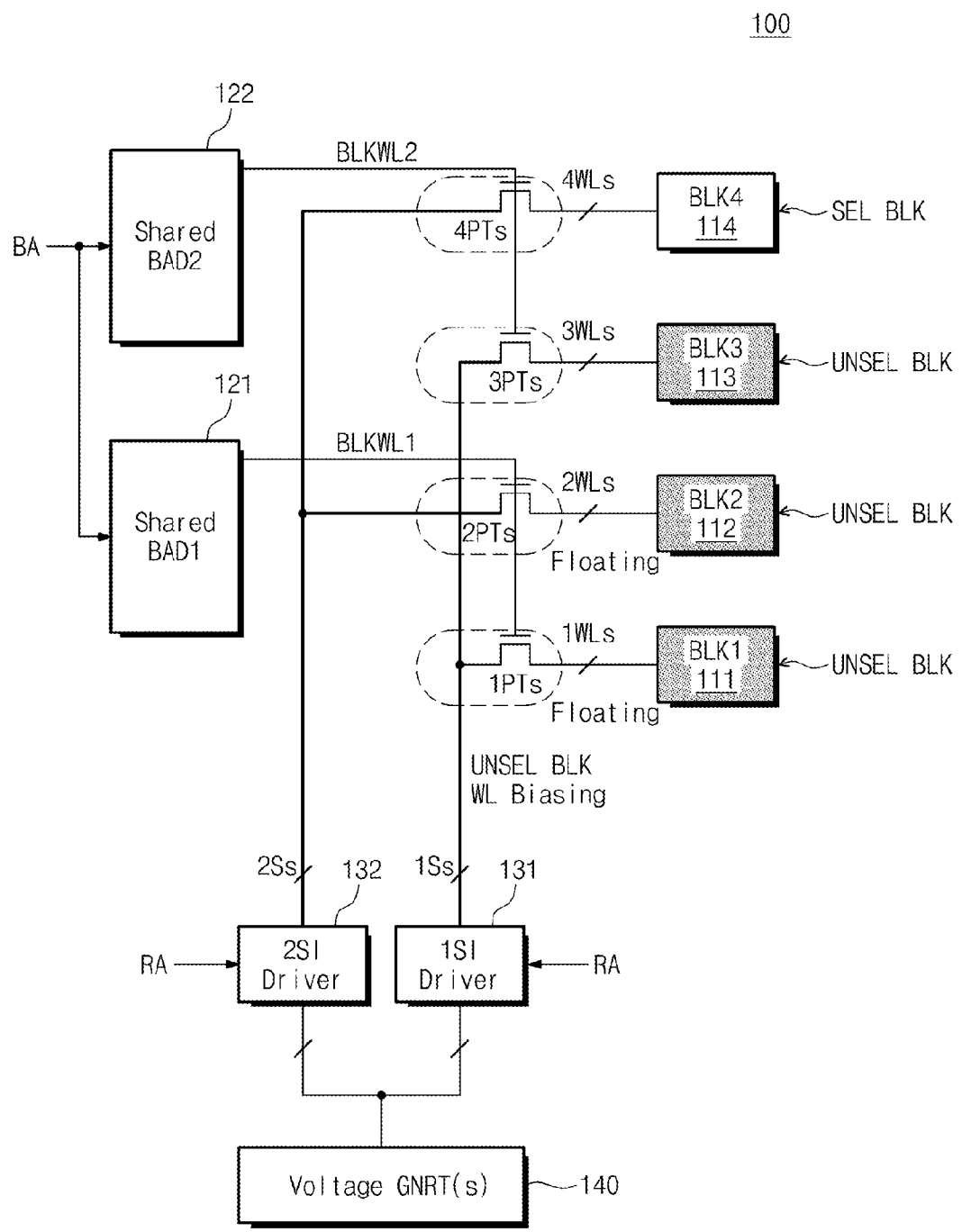
FIG. 5 is a diagram for reference in describing an activated unselected block and an inactivated unselected block of a nonvolatile memory device 100 according to an embodiment of the inventive concept.

FIG. 5 is a diagram for reference in describing an activated unselected block and an inactivated unselected block of a nonvolatile memory device 100 according to an embodiment of the inventive concept. For simplicity of description, it is assumed that third and fourth blocks 113 and 114 are activated in response to a block address BA, and first and second blocks 111 and 112 are inactivated in response thereto. In exemplary embodiments, whether a block is activated is determined based on whether pass transistors 1PTs through 4PTs are turned on. That is, whether a block is activated is determined based on a voltage level of each of block word lines BLKWL1 and BLKWL2. Thus, an unselected block 113 that is connected to a shared block word line BLKWL2 associated with a selected block 114 is an activated unselected block, and remaining unselected blocks 111 and 112 are inactivated unselected blocks.

First source lines 1Ss are shared by the first block 111 and the third block 113, and second source lines 2Ss are shared by the second block 112 and the fourth block 114.

Assuming that a program/read/erase operation is performed with respect to at least one word line of the fourth block 114 in response to an input row address RA, the fourth block 114 may be a selected block. In this case, remaining blocks 111 and 112 may be unselected blocks. The first and second blocks 111 and 112 are inactivated unselected blocks (a second unselected block), and the third block 113 is an activated unselected block (a first unselected block).

Below, it is assumed that an activated unselected block (e.g., block 113) is referred to as a "first unselected block" and inactivated unselected blocks (e.g., blocks 111 and 112) are referred to as "second unselected blocks". Upon operating a selected block, unselected word line biasing is made with respect to word lines of the first unselected block 113, and word lines of the second unselected blocks 111 and 112 are electrically floated.

Figure 6:
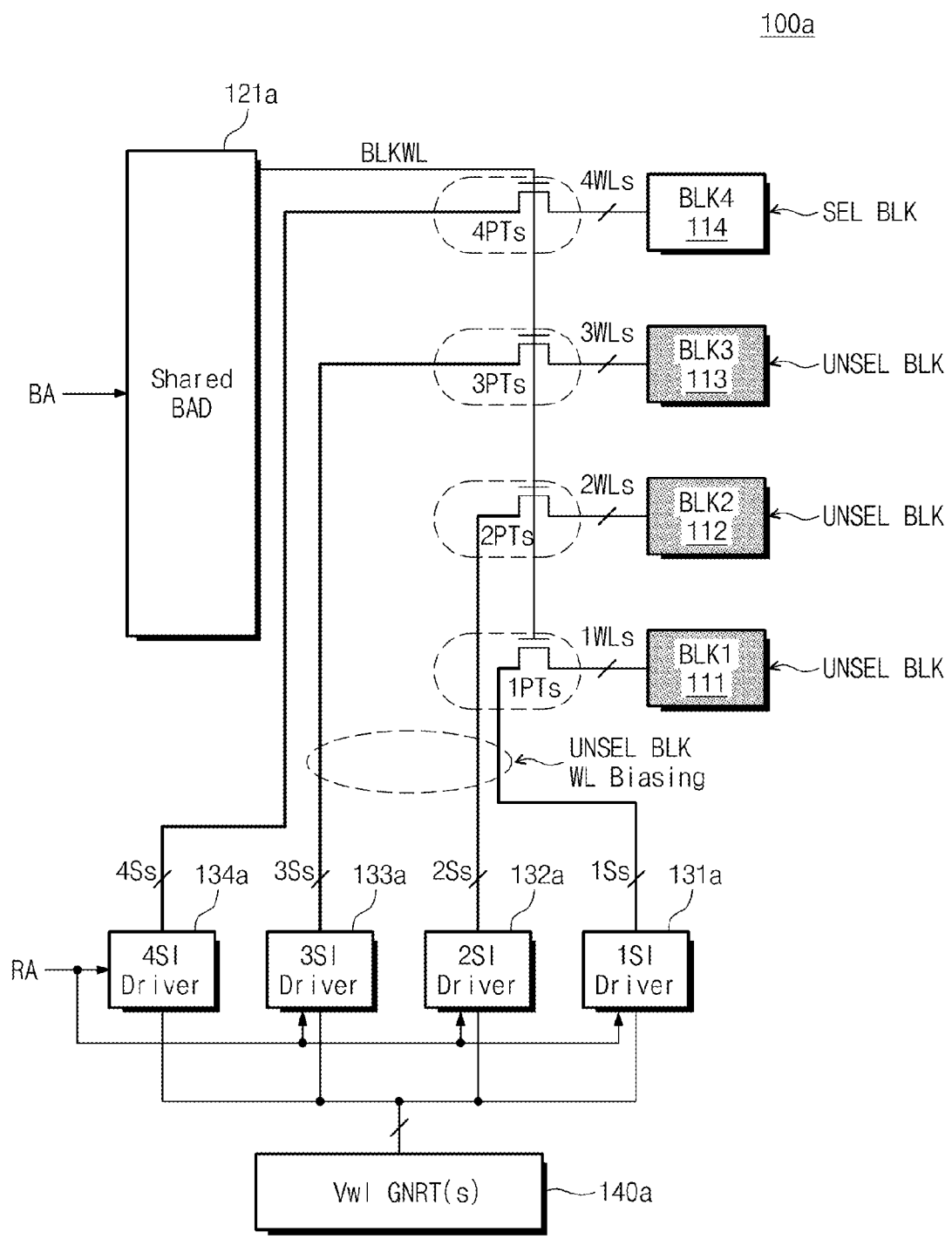
FIG. 6 is a block diagram schematically illustrating a nonvolatile memory device according to another embodiment of the inventive concept.

FIG. 6 is a block diagram schematically illustrating a nonvolatile memory device according to another embodiment of the inventive concept. Referring to FIG. 6, a nonvolatile memory device 100a contains four blocks 111 through 114 that share a block address decoder 121a.

Source line drivers 131a through 134a provides source lines 1Ss through 4Ss with voltages, corresponding to a row address RA, from among word line voltages. The source lines 1Ss through 4Ss are connected to word lines 1WLs through 4WLs of the blocks 111 through 114 through pass transistors 1PTs through 4PTs.

For the sake of easy understanding, in FIG. 6, it is assumed that the fourth block 114 is a selected block and remaining blocks 111 through 113 are unselected blocks. That is, it is assumed that a program, a read, or an erase operation is performed at the fourth block 114. In this case, the remaining blocks 111 through 113 are unselected blocks, and the source line drivers 131a through 133a perform voltage biasing with respect to word lines 1WLs to 3WLs of the unselected blocks to prevent negative boosting.

Figure 7:
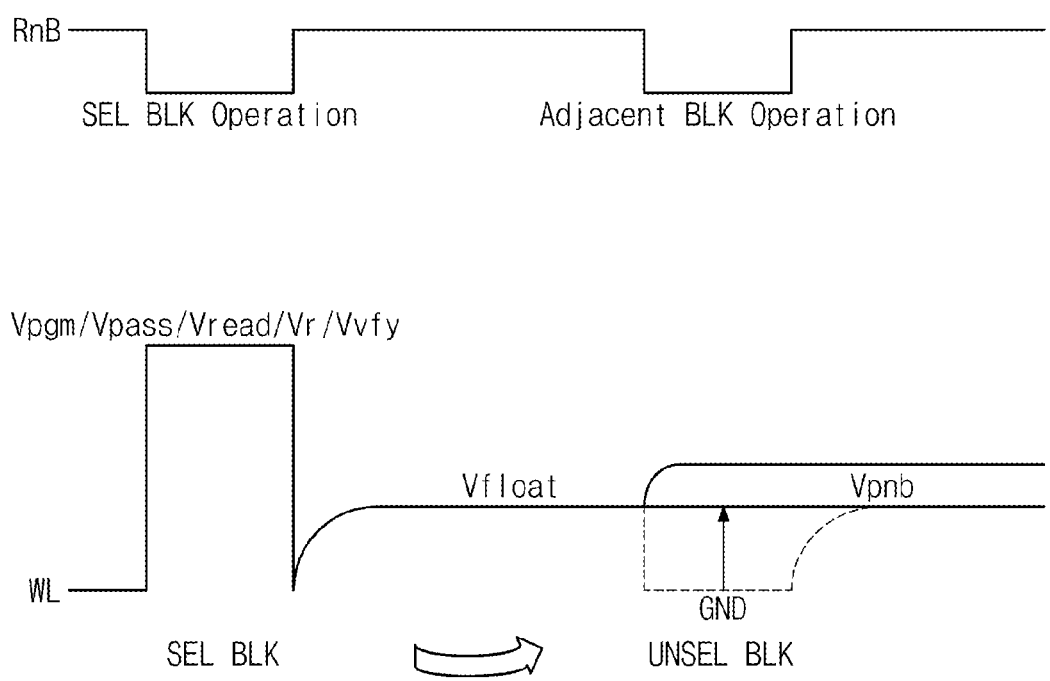
FIG. 7 is a conceptual diagram for reference in describing word line biasing for preventing negative boosting of an unselected block, according to an embodiment of the inventive concept.

FIG. 7 is a conceptual diagram for reference in describing word line biasing for preventing negative boosting of an unselected block, according to an embodiment of the inventive concept. Referring to FIG. 7, a selected block operates, with a ready/busy signal RnB low. At this time, a driving voltage (e.g., a program voltage Vpgm, a pass voltage Vpass, a read pass voltage Vread, a read voltage Vr, or a verification voltage Vvfy) is applied to a word line WL of the selected block. After an operation about the selected block is completed, a voltage of the word line WL is discharged through a recovery operation. The ready/busy signal RnB transitions to a high state because an operation about the selected block is completed. At this time, the word line WL is floated and is set to a specific voltage Vfloat due to coupling.

Afterwards, an operation about an adjacent block is performed, with the ready/busy signal RnB high. At this time, a block having the word line WL may be an unselected block.

In a conventional nonvolatile memory device, a floating voltage Vfloat of a word line WL of an unselected block drops to a ground voltage GND at an operation of an adjacent block, thereby causing negative boosting in a moment. In a nonvolatile memory device 100 according to an embodiment of the inventive concept, a negative coupling prevention voltage Vpnb is applied to a word line WL of an unselected block at an operation of an adjacent block, thereby preventing the negative coupling essentially. In exemplary embodiments, a level of the negative coupling prevention voltage Vpnb may be higher than or equal to that of the floating voltage Vfloat. In other exemplary embodiments, a level of the negative coupling prevention voltage Vpnb may be higher than that of a ground voltage GND.

Meanwhile, the nonvolatile memory device 100 according to an embodiment of the inventive concept may be implemented such that a word line WL of an unselected block is maintained at the floating voltage Vfloat when an adjacent block operates.

Figure 8:
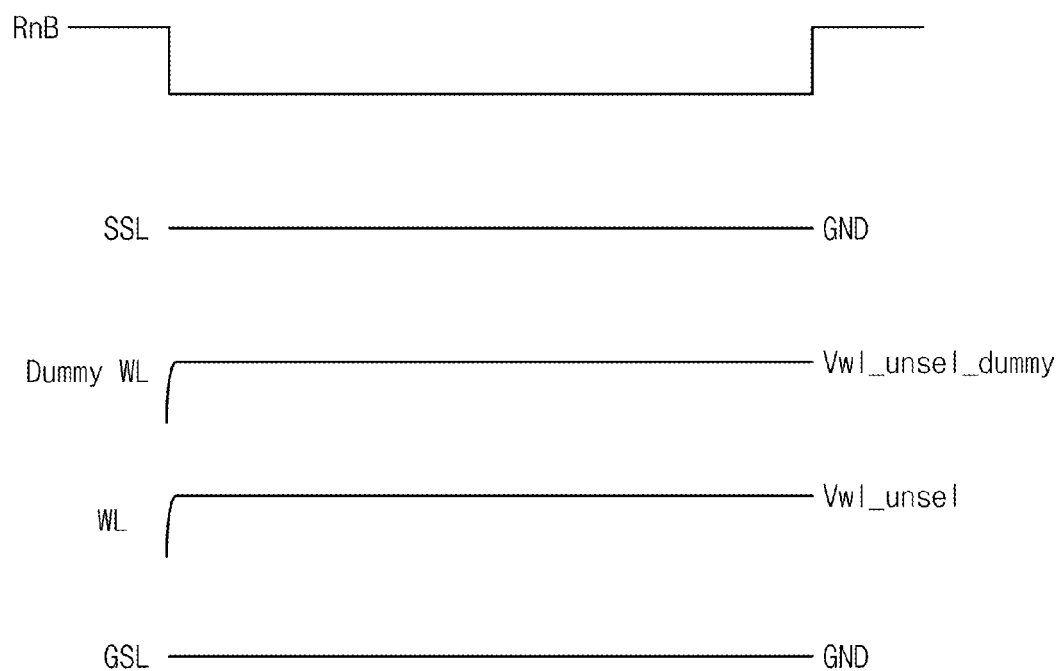
FIG. 8 is a diagram for reference in describing an unselected block word line biasing method of a nonvolatile memory device according to an embodiment of the inventive concept.

FIG. 8 is a diagram for reference in describing an unselected block word line biasing method of a nonvolatile memory device according to an embodiment of the inventive concept. Referring to FIGS. 1 through 8, t the following word line biasing about an unselected block may be made at an operation of an adjacent block including at least one of a program operation, a read operation, or a verification read operation. A ready/busy signal RnB remains at a low state because the adjacent block operates. At this time, a ground voltage GND is applied to a string selection line SSL and a ground selected line GSL of the unselected block. A dummy unselected block word line voltage Vwl_unsel_dummy is applied to at least one dummy word line, and an unselected block word line voltage Vwl_unsel is applied to a word line WL. The dummy unselected block word line voltage Vwl_unsel_dummy and the unselected block word line voltage Vwl_unsel may be a negative boosting prevention voltage Vpnb shown in FIG. 7.

Figure 9:
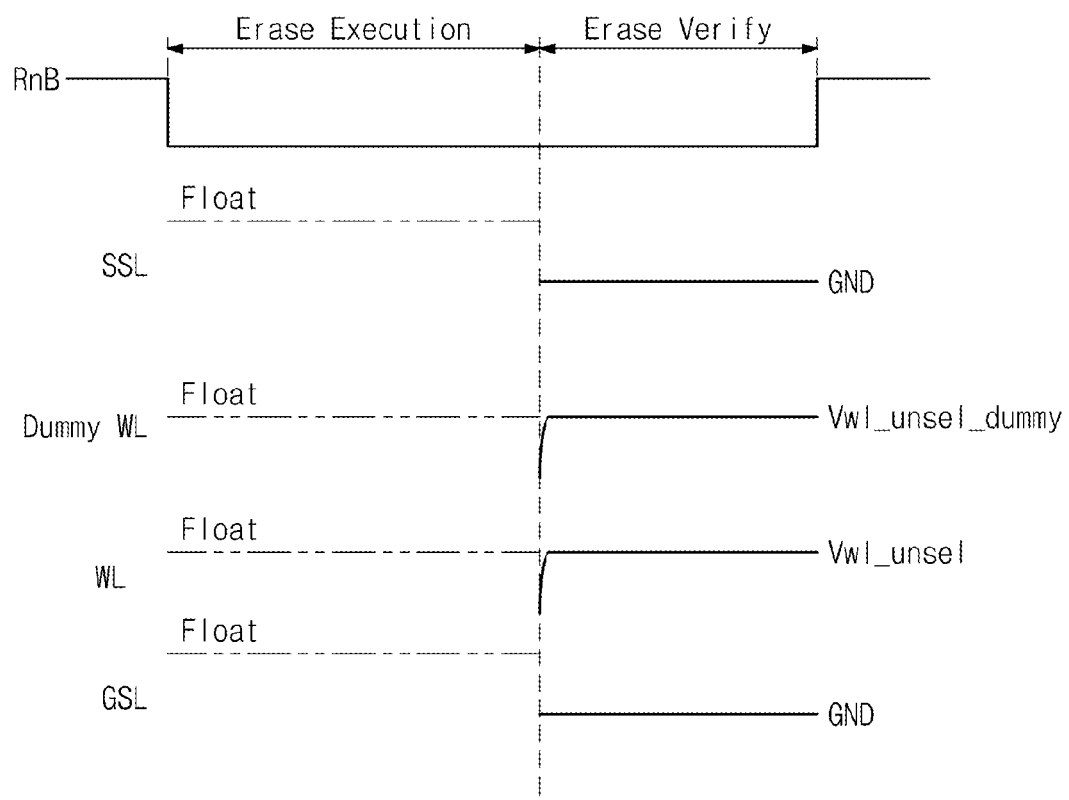
FIG. 9 is a diagram for reference in describing an unselected block word line biasing method of a nonvolatile memory device according to another embodiment of the inventive concept.

FIG. 9 is a diagram for reference in describing an unselected block word line biasing method of a nonvolatile memory device according to another embodiment of the inventive concept. Referring to FIGS. 1 through 7 and 9, the following word line biasing about an unselected block may be made at an erase operation of an adjacent block.

An erase operation is divided into an erase execution period and an erase verification period. In the erase execution period, a string selection line SSL, a dummy word line, a word line WL, and a ground selected line GSL all remain at a floating state. In the erase verification period, a ground voltage GND is applied to the string selection line SSL and the ground selected line GSL, a dummy unselected block word line voltage Vwl_unsel_dummy is applied to the dummy word line, and an unselected block word line voltage Vwl_unsel is applied to the word line WL.

An embodiment of the inventive concept is exemplified as a shared block address decoder described with reference to FIGS. 1 through 9 is disposed at one side of blocks. However, the scope and spirit of the inventive concept is not limited thereto. The shared block address decoder may be disposed at both sides of a block.

Figure 10:
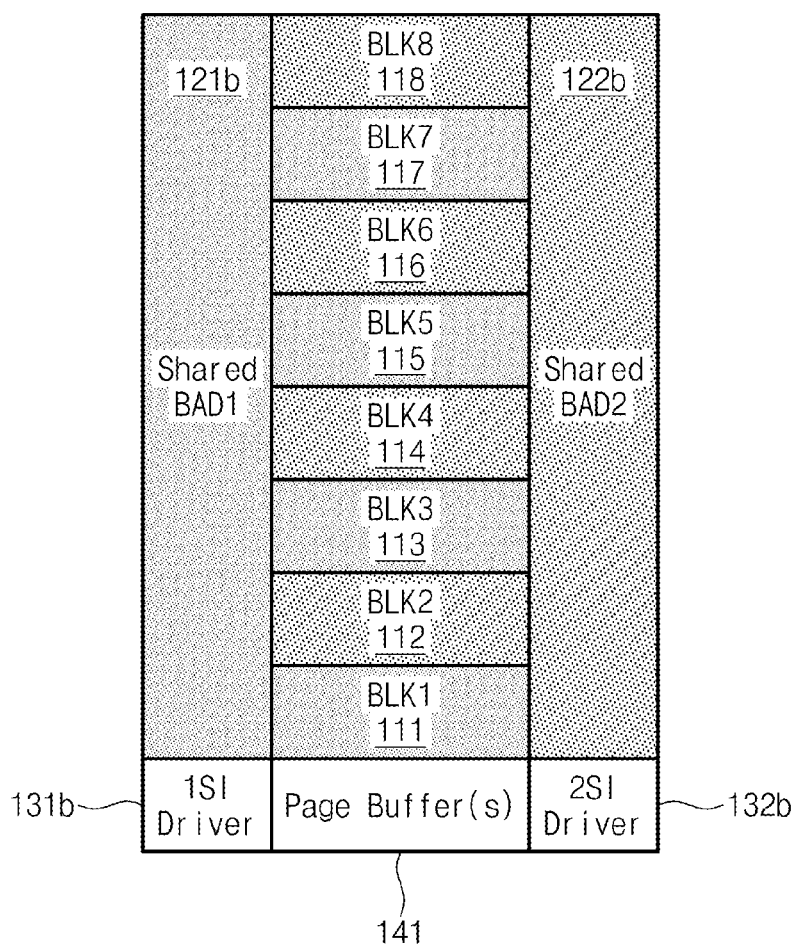
FIG. 10 is a diagram schematically illustrating a nonvolatile memory device according to still another embodiment of the inventive concept.

FIG. 10 is a diagram schematically illustrating a nonvolatile memory device according to still another embodiment of the inventive concept. Referring to FIG. 10, a nonvolatile memory device 100b includes shared block address decoders 121b and 122b disposed at left and right sides of blocks 111 through 118. The shared block address decoder 121b is connected to four odd-numbered blocks 111, 113, 115, and 117, and the shared block address decoder 122b is connected to four even-numbered blocks 112, 114, 116, and 118. A first source line decoder 131b is disposed at a lower end of the shared block address decoder 121b, and a second source line decoder 132b is disposed at a lower end of the shared block address decoder 122b. A page buffer circuit 141 is disposed at a lower end of blocks 111 through 118.

Figure 11:
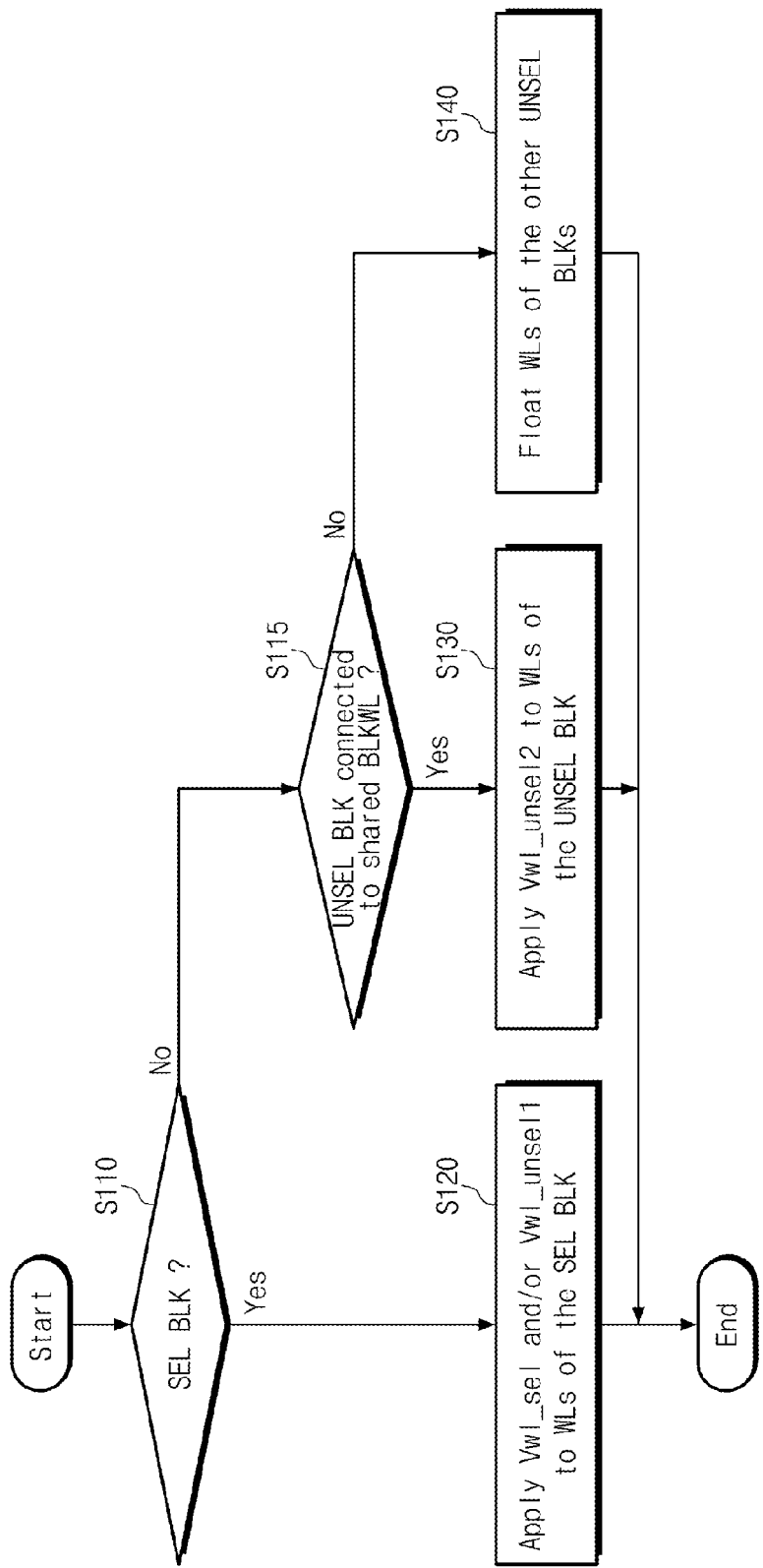
FIG. 11 is a flow chart showing a driving method of a nonvolatile memory device according to an embodiment of the inventive concept.

FIG. 11 is a flow chart showing a driving method of a nonvolatile memory device according to an embodiment of the inventive concept. A driving method of a nonvolatile memory device will be more fully described with reference to FIGS. 1 through 11.

In step S110, whether a block is a selected block is determined based on an input row address RA. As a consequence of determining that a block is a selected block, in step S120, a selected word line voltage Vwl_sel and/or at least one first unselected word line voltage Vwl_unsel1 is applied to word lines of the selected block. Here, the selected word line voltage Vwl_sel may be a program voltage to be applied to a selected word line at a program operation, a program verification voltage to be applied to a selected word line at a program verification operation, or a read voltage to be applied to a selected word line at a read operation. Also, the first unselected word line voltage Vwl_unsel1 may be a program pass voltage to be applied to unselected word lines at a program operation or a read pass voltage to be applied to unselected word lines at a program verification operation or a read operation. Also, the selected word line voltage Vwl_sel may be an erase word line voltage to be applied to word lines at an erase operation.

As a consequence of determining that a block is not a selected block, in step S115, whether the block is an unselected block connected to a block word line shared with the selected block is determined based on the row address RA. When the block is the unselected block connected to the shared block word line, in step S130, at least one second unselected word line voltage Vwl_unsel2 (or, an unselected block word line voltage) is applied to word lines of the unselected block. When the block is not the unselected block connected to the shared block word line, in step S140, word lines of remaining unselected blocks (second unselected block) are floated.

As described above, the unselected word line voltage Vwl_unsel2 is applied to word lines of the unselected block connected to a block word line shared with the selected block, and word lines of remaining unselected blocks are floated.

Meanwhile, a word line voltage generating circuit 140 shown in FIG. 1 may include a plurality of word line voltage generators.

Figure 12:
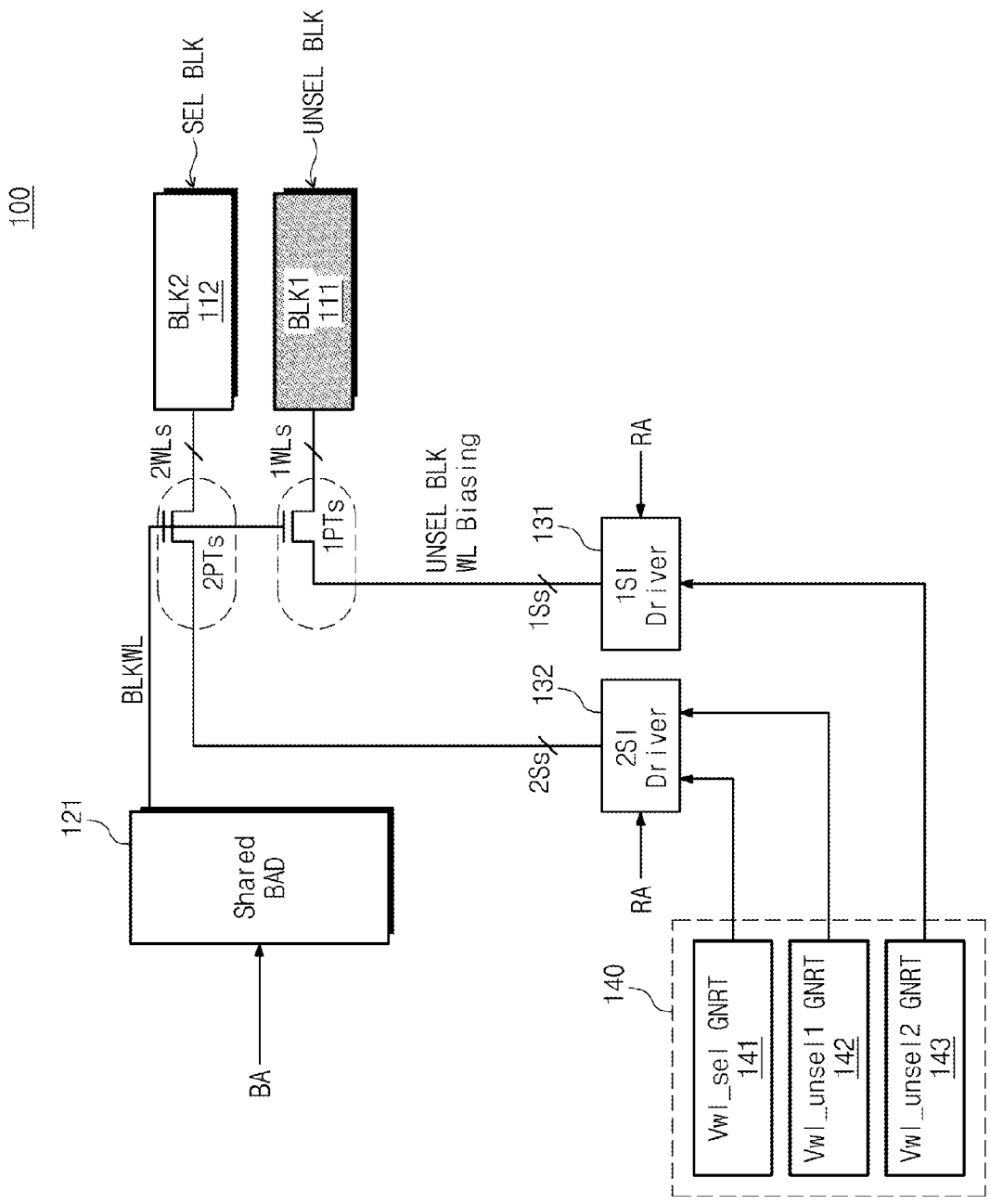
FIG. 12 is a diagram schematically illustrating a word line voltage generating circuit 140 according to an embodiment of the inventive concept.

FIG. 12 is a diagram schematically illustrating a word line voltage generating circuit 140 according to an embodiment of the inventive concept. Referring to FIGS. 1 and 12, a word line voltage generating circuit 140 contains a selected word line voltage generator 141, a first unselected word line voltage generator 142, and a second unselected word line voltage generator 143.

The selected word line voltage generator 141 generates a selected voltage Vwl_sel to be applied to a selected block (e.g., 112). The selected voltage Vwl_sel may include the following: a read voltage Vr, a read verification voltage Vvfy, an erase word line voltage, and an erase verification voltage.

The first unselected word line voltage generator 142 generates a first unselected word line voltage Vwl_sel1 to be applied to the selected block 112. The first unselected word line voltage Vwl_sel1 may include the following: a program pass voltage Vpass at a program operation and a read pass voltage Vread at a read operation.

The second unselected word line voltage generator 143 generates a second unselected word line voltage (or, an unselected block word line voltage) Vwl_unsel2 to be applied to an unselected block (e.g., 111) that is connected with a block word line shared with the selected block 112. The second unselected word line voltage Vwl_sel2 may include a negative boosting word line voltage Vpnb (refer to FIG. 7) for preventing negative boosting.

Meanwhile, each of the second unselected word line voltage generators 142 and 143 may include a plurality of voltage generators that applies an unselected word line voltage that varies according to a word line or with a group of word lines.

Figure 13:
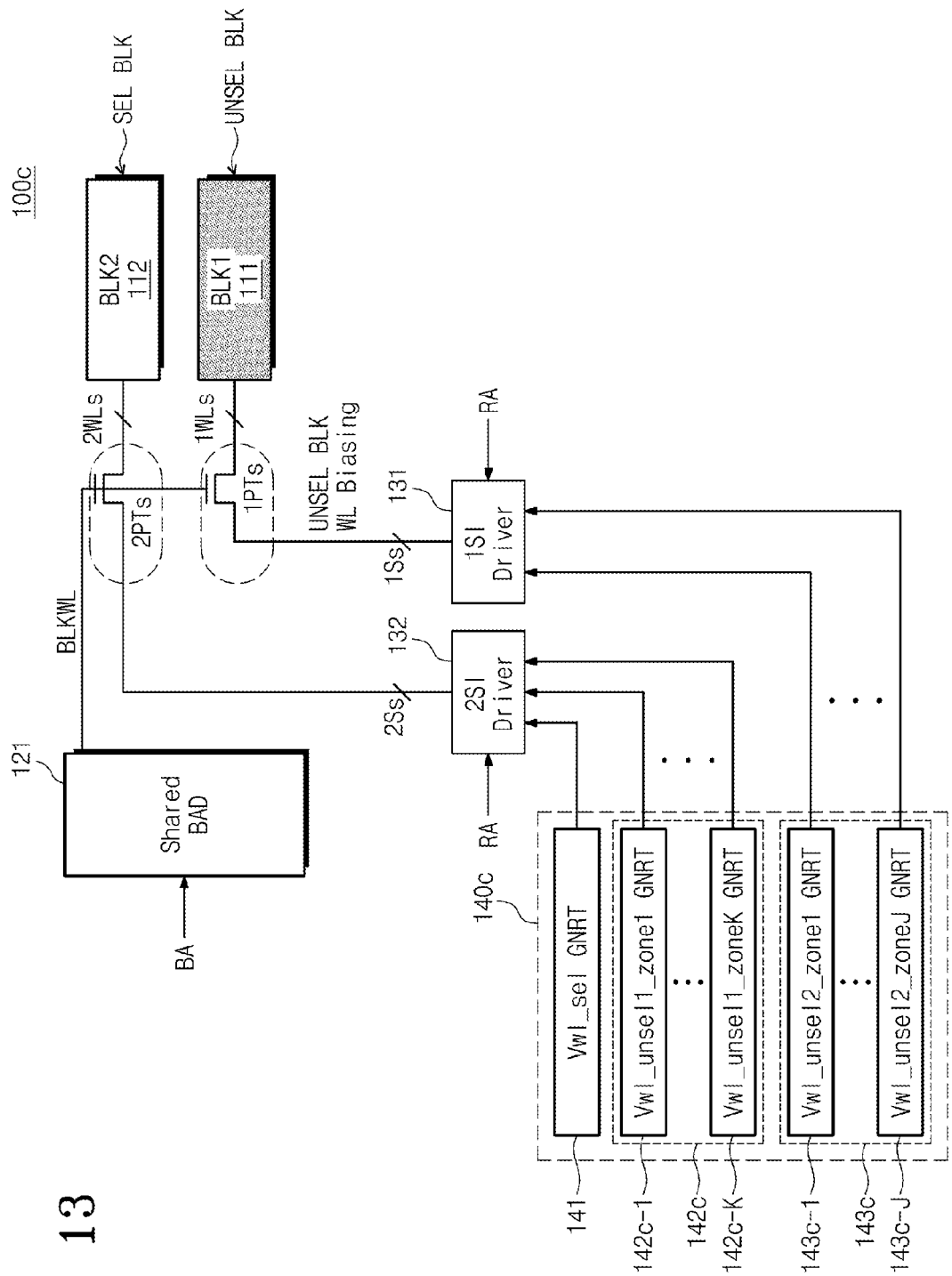
FIG. 13 is a diagram showing a nonvolatile memory device according to still another embodiment of the inventive concept.

FIG. 13 is a diagram showing a nonvolatile memory device according to still another embodiment of the inventive concept. As compared with a nonvolatile memory device 100 shown in FIG. 12, a nonvolatile memory device 100c shown in FIG. 13 contains a word line voltage generating circuit 140c that includes a first unselected voltage generator 142c and a second unselected voltage generator 143c. The first unselected voltage generator 142c generates unselected word line zone voltages Vwl_unsel1_zone1 through Vwl_unsel1_zoneK corresponding to a plurality of zones, and the second unselected voltage generator 143c generates unselected word line zone voltages Vwl_unsel2_zone1 through Vwl_unsel2_zoneK corresponding to the plurality of zones.

The first unselected voltage generator 142c contains first unselected word line zone voltage generators 142c-1 through 142c-K (K being an integer of 2 or more) that generate first unselected word line zone voltages Vwl_unsel1_zone1 through Vwl_unsel1_zoneK to be applied to a selected block (e.g., 112). The selected block may be divided into zones based on a word line or a group of word lines. The group of word lines may be determined based on structural, physical information such as a location of a word line and a shape of a memory cell connected to a word line.

The second unselected voltage generator 143c includes second unselected word line zone voltage generators 143c-1 through 143c-J (K being an integer of 2 or more) that generate second unselected word line zone voltages Vwl_unsel2_zone1 through Vwl_unsel2_zoneJ to be applied to an unselected block (e.g., 111).

In exemplary embodiments, the number of generators constituting the first unselected voltage generator 142c may be equal to or different from the number of generators constituting the second unselected voltage generator 143c.

Meanwhile, a nonvolatile memory device according to an embodiment of the inventive concept may perform word line biasing using a temperature of a memory cell.

Figure 14:
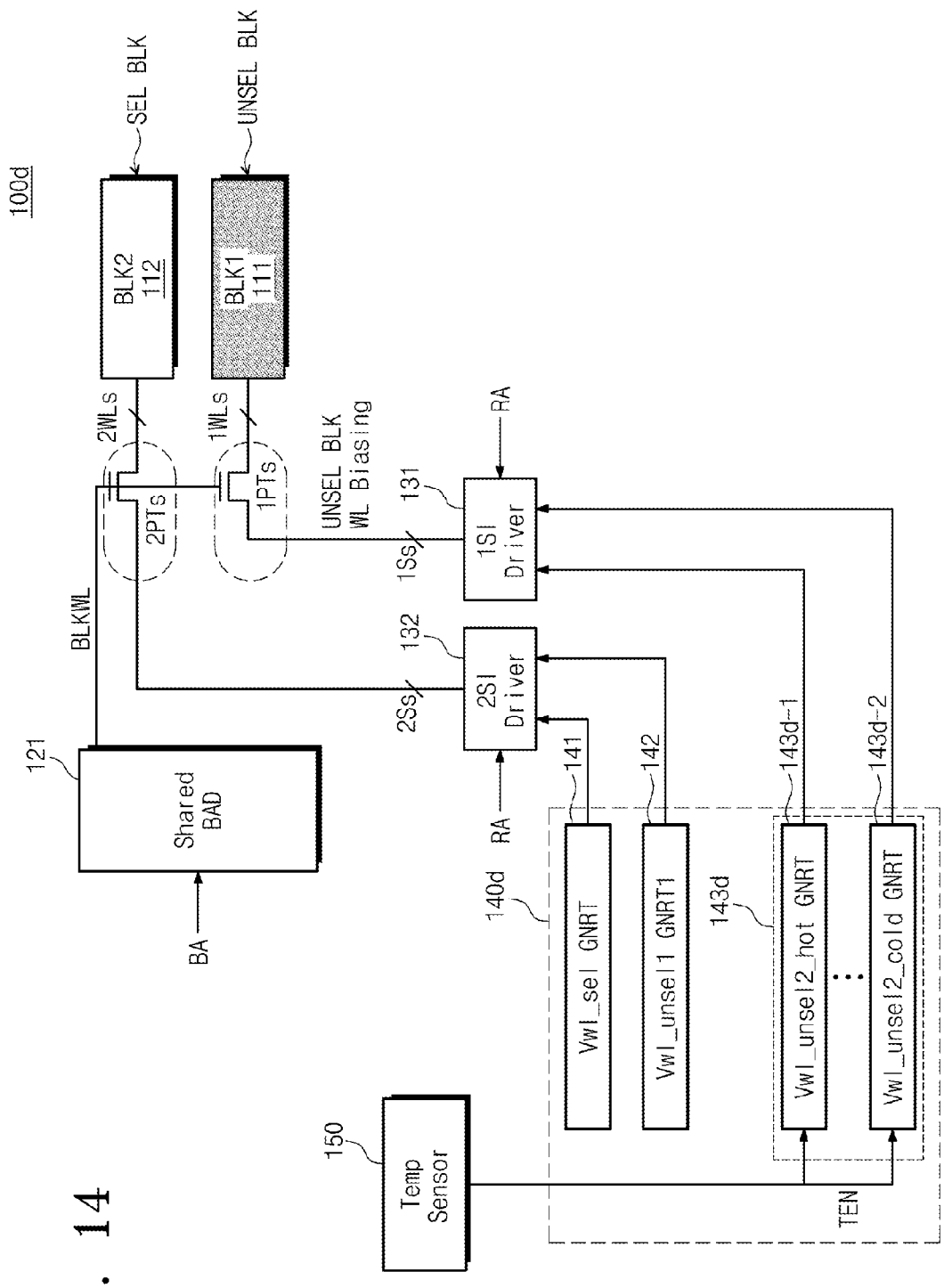
FIG. 14 is a diagram showing a nonvolatile memory device according to a further embodiment of the inventive concept.

FIG. 14 is a diagram showing a nonvolatile memory device according to a further embodiment of the inventive concept. Referring to FIG. 14, a nonvolatile memory device 100d contains a word line voltage generating circuit 140d having a second unselected voltage generator 143d different from that of a nonvolatile memory device shown in FIG. 12 and a temperature sensor 150 to generate a temperature application enable signal TEN.

The second unselected voltage generator 143d includes a second unselected voltage generator 143d-1 for high temperature to a second unselected voltage Vwl_unsel2_hot for high temperature and a second unselected voltage generator 143d-2 for low temperature to a second unselected voltage Vwl_unsel2_cold for low temperature.

The second unselected voltage generator 143d-1 for high temperature and the second unselected voltage generator 143d-2 for low temperature are selectively activated in response to the temperature application enable signal TEN.

The temperature sensor 150 generates the temperature application enable signal TEN when a temperature of a memory cell (e.g., a temperature associated with an unselected block 111) exceeds a reference temperature. In exemplary embodiments, the temperature sensor 150 may be implemented to have a memory cell structure.

In FIG. 14, an embodiment of the inventive concept is exemplified as a temperature is classified as a high temperature or a low temperature based on one reference temperature and the activation of the second unselected voltage generator 143d-1 and 143d-2 is determined based on the classified temperature. However, the scope and spirit of the inventive concept is not limited thereto. For example, a nonvolatile memory device according to an embodiment of the inventive concept may determine whether activate three or more second unselected voltage generators based on two or more reference temperatures.

The word line voltage generating circuit 140d according to an embodiment of the inventive concept activates one of a plurality of second unselected word line voltage generators 143d-1 and 143d-2 in response to the temperature application enable signal TEN. However, the scope and spirit of the inventive concept is not limited thereto. The word line voltage generating circuit according to an embodiment of the inventive concept may be implemented to have a structure capable of compensating for a second unselected word line voltage (or, an unselected block word line voltage) Vwl_unsel2 based on a temperature.

In FIG. 14, an embodiment of the inventive concept is exemplified as a temperature is applied to the second unselected word line voltage Vwl_unsel2. However, the scope and spirit of the inventive concept is not limited thereto. For example, a nonvolatile memory device according to an embodiment of the inventive concept may be implemented such that a temperature is applied to a selected word line voltage Vwl_sel and/or a first unselected word line voltage Vwl_unsel1.

In FIG. 14, the nonvolatile memory device 100d produces temperature-associated information (e.g., temperature application enable signal TEN) using the temperature sensor 150 and generates a temperature-based word line voltage using the temperature-associated information. However, the scope and spirit of the inventive concept is not limited thereto. For example, the nonvolatile memory device 100d may receive temperature information from an external device (e.g., memory controller or host) and generates a temperature-based word line voltage using the input temperature information.

Figure 15:
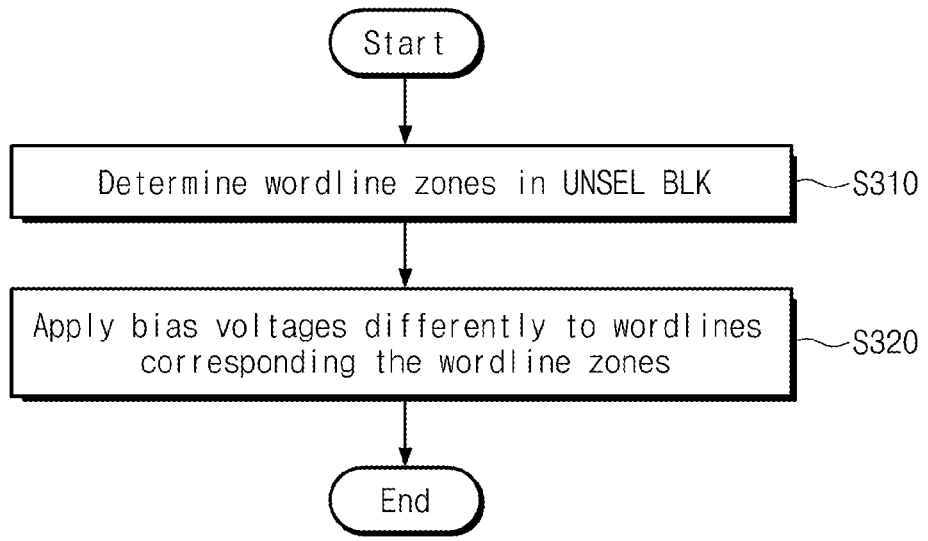
FIG. 15 is a flow chart for describing an unselected word line biasing method of a nonvolatile memory device according to an embodiment of the inventive concept.

FIG. 15 is a flow chart for describing an unselected word line biasing method of a nonvolatile memory device according to an embodiment of the inventive concept. An unselected word line biasing method of a nonvolatile memory device will be more fully described with reference to FIGS. 13 through 15.

In step S310, word line zones of an unselected block are determined. In step S320, different bias voltages (or, a second unselected word line voltage Vwl_unsel2, in other words, an unselected block word line voltage) are applied to word lines corresponding to word line zones. In the unselected word line biasing method described above, different bias voltages are applied to word line zones.

Figure 16:
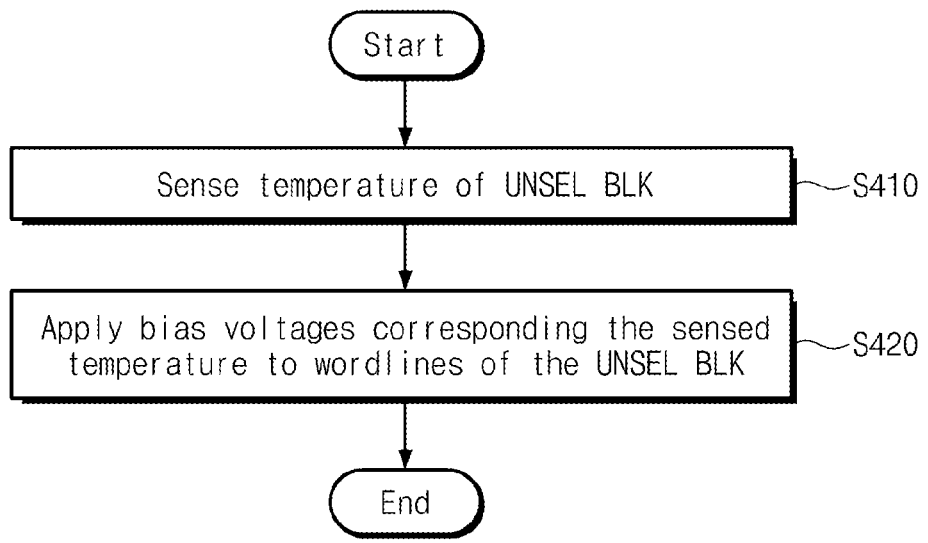
FIG. 16 is a flow chart for describing an unselected word line biasing method of a nonvolatile memory device according to an embodiment of the inventive concept.

FIG. 16 is a flow chart for describing an unselected word line biasing method of a nonvolatile memory device according to an embodiment of the inventive concept. An unselected word line biasing method of a nonvolatile memory device will be more fully described with reference to FIGS. 13, 14, and 16. In step S410, a temperature of an unselected block is detected. In step S420, bias voltages corresponding to the sensed temperature are applied to word lines of the unselected block. In the unselected word line biasing method described above, word lines are supplied with bias voltages that vary with a temperature.

Figure 17:
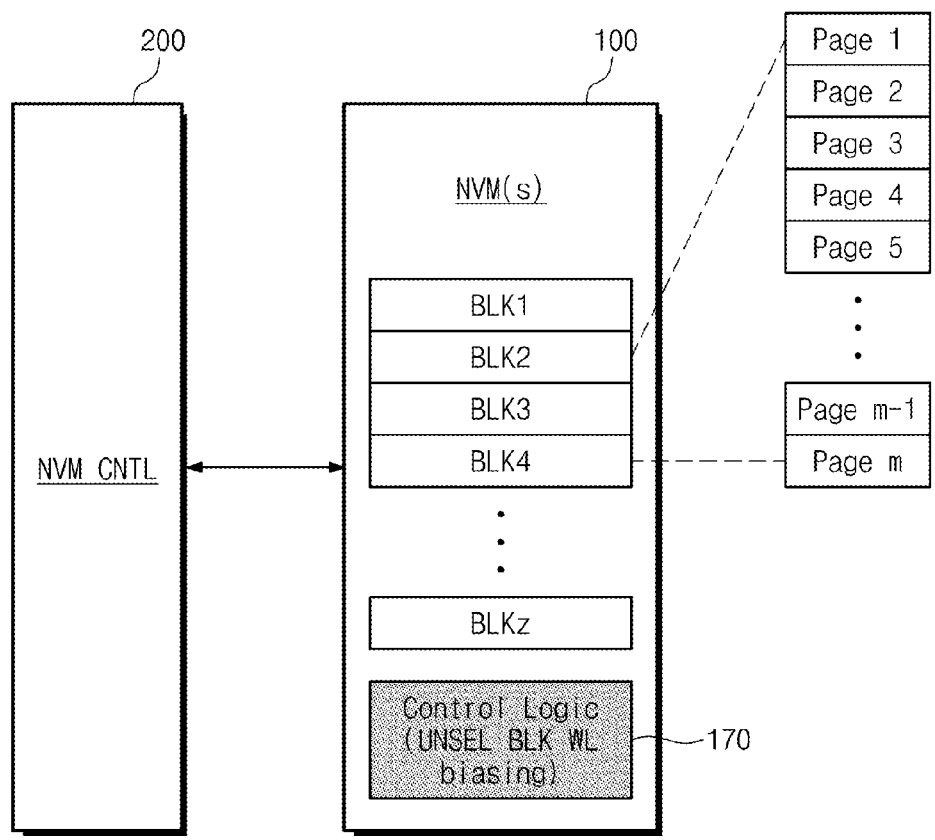
FIG. 17 is a diagram showing a storage device according to an embodiment of the inventive concept.

FIG. 17 is a diagram showing a storage device according to an embodiment of the inventive concept. Referring to FIG. 17, a storage device 10 contains at least one nonvolatile memory device 100 and a memory controller 200 to control the nonvolatile memory device 100.

The nonvolatile memory device 100 includes a plurality of blocks BLK1 through BLKz (z being an integer of 2 or more) and control logic 170 to control operations of the blocks BLK1 through BLKz. Each of the blocks BLK1 through BLKz includes a plurality of pages Page 1 through Page m (m being an integer of 2 or more).

The control logic 170 of this example is configured to determine whether word line biasing of an unselected word line is to be performed, and to control the word line voltage generating circuit 140 and the shared block address decoder 121 shown in FIG. 1 accordingly. Word line biasing of the unselected block is described above with reference to FIGS. 1 through 16, and a detailed description thereof is thus omitted.

In the storage device 10 of the embodiment of FIG. 17, the nonvolatile memory device 100 internally determines whether word line biasing of the unselected block is to be performed. However, the scope and spirit of the inventive concept is not limited thereto, and for example, as described next, such functionality can be carried out by the memory controller 200.

Figure 18:
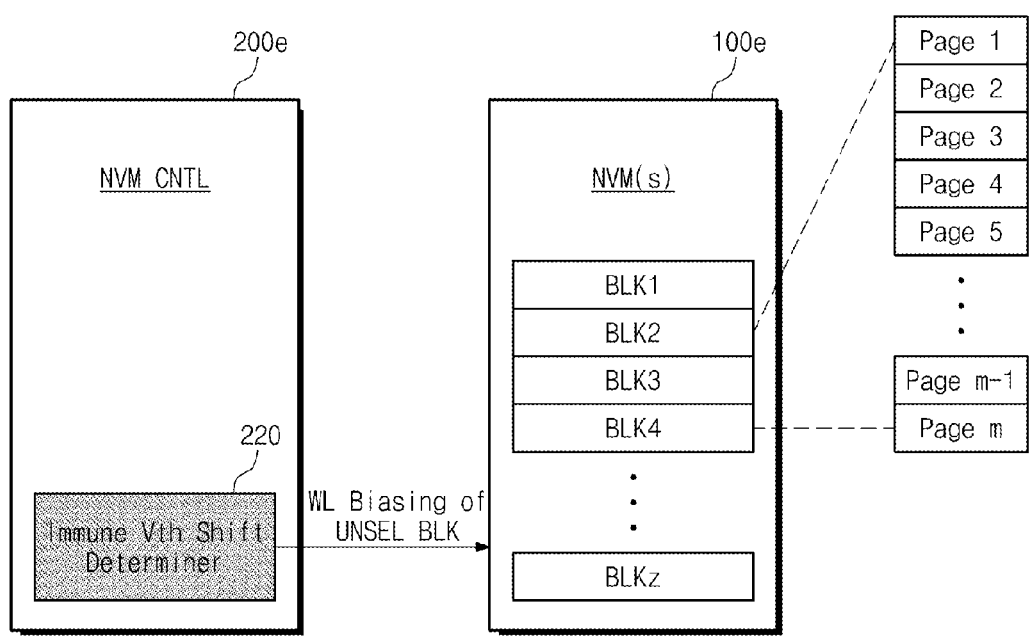
FIG. 18 is a diagram showing a storage device according to another embodiment of the inventive concept.

FIG. 18 is a diagram showing a storage device according to another embodiment of the inventive concept. Referring to FIG. 18, a storage device 20 contains at least one nonvolatile memory device 100e and a memory controller 200e to control the nonvolatile memory device 100e. The storage device 20 differs from that shown in FIG. 17 in that the memory controller 200e determines whether to perform word line biasing of an unselected block.

The memory controller 200e includes an immune threshold voltage shift determiner 220 that determines immunity about a threshold voltage shift of an unselected block at which data is stored, determines whether to perform word line biasing of an unselected block based on the determining result, and provides the nonvolatile memory device 100e with information indicating the execution of the word line biasing of the unselected block. In exemplary embodiments, the immune threshold voltage shift determiner 220 may be implemented in the form of hardware, software, firmware, or a combination thereof.

Figure 19:
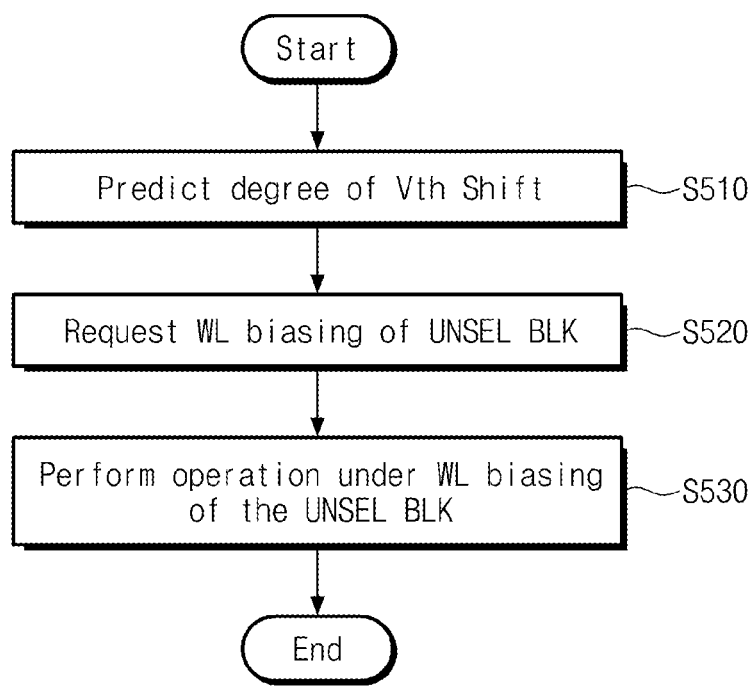
FIG. 19 is a flow chart showing an operating method of a storage device according to an embodiment of the inventive concept.

FIG. 19 is a flow chart showing an operating method of a storage device according to an embodiment of the inventive concept. Referring to FIGS. 18 and 19, in step S510, an immune threshold voltage shift determiner 220 of a memory controller 200e predicts the degree of a threshold voltage shift of an unselected block when a selected block operates. Here, the unselected block may be a block that is programmed.

For example, the case that a program elapsed time of the unselected block exceeds a predetermined value or that a value of a program/erase (PE) cycle of the unselected block exceeds a predetermined value may be determined as the case that the degree of a threshold voltage shift of an unselected block is great. When the degree of a threshold voltage shift of an unselected block is predicted to be great at an operation corresponding to an operation command, in step S520, the memory controller 200e requests word line biasing of the unselected block. The prediction of the degree of a threshold voltage shift may be provided using various parameters such that whether or not of programming of the unselected block, a temperature, and the degree of deterioration. In step S530, the nonvolatile memory device 100e performs biasing about word lines of the unselected block in response to the word line biasing request of the unselected block and processes an operation corresponding to an operation command.

An operating method of the storage device 20 according to an embodiment of the inventive concept may determine word line biasing of an unselected block in the light of the degree of a threshold voltage shift thus predicted.

Figure 20:
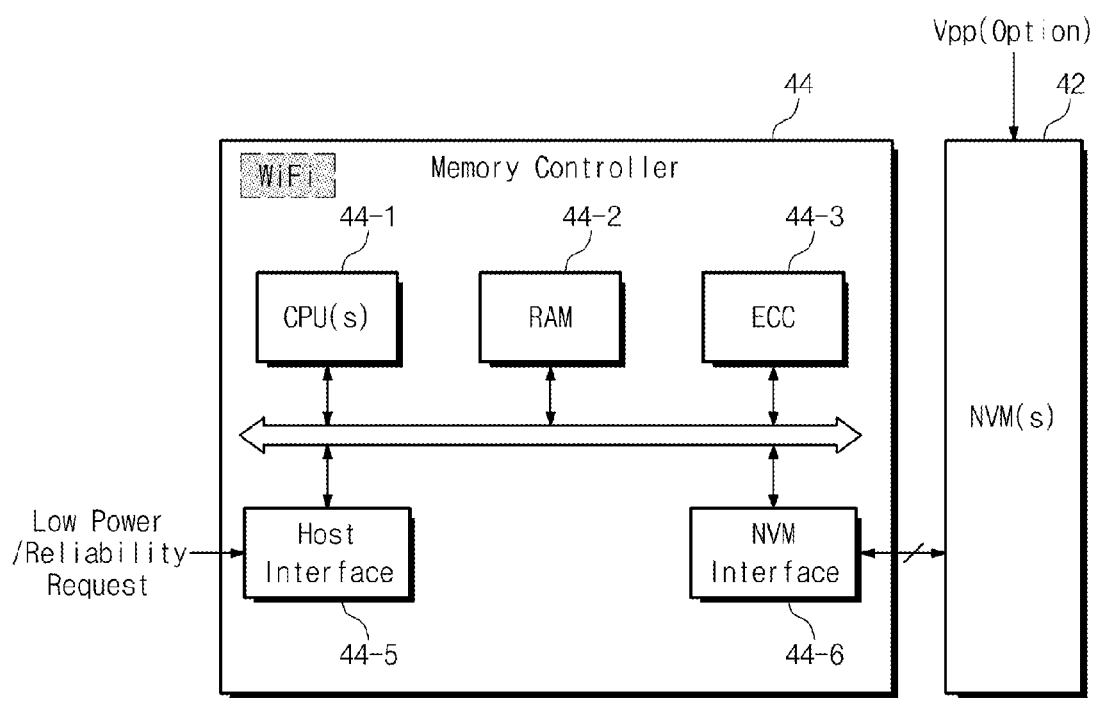
FIG. 20 is a block diagram schematically illustrating a memory system according to an embodiment of the inventive concept.

FIG. 20 is a block diagram schematically illustrating a memory system according to an embodiment of the inventive concept. Referring to FIG. 20, a memory system 40 contains at least one nonvolatile memory device 42 and a memory controller 44 to control the nonvolatile memory device 42. The storage device 40 shown in FIG. 20 may be used as, but not limited to, a storage medium of a memory card (e.g., compact flash (CF), SD, micro SD, and so on) or a universal serial bus (USB) storage device.

The nonvolatile memory device 42 may be implemented with a nonvolatile memory device that performs word line biasing of an unselected block described with reference to FIGS. 1 through 19. The memory controller 44 may be implemented with a memory controller 200 shown in FIG. 17 or with a memory controller 200e shown in FIG. 18.

The memory controller 44 starts to perform the word line biasing of the unselected block according to a specific request of a host. For example, when receiving a request about a reliability read mode of operation or a high-speed read operation from the host, the memory controller 44 first performs the word line biasing of the unselected block.

The memory controller 44 controls read, write, and erase operations of the nonvolatile memory device 42 in response to a host request. The memory controller 44 contains at least one central processing unit 44-1, a buffer memory (hereinafter referred to as "RAM") 44-2, an ECC block 44-3, a host interface 44-5, and an NVM interface 44-6.

The central processing unit 44-1 controls an overall operation of the nonvolatile memory device 42 such as writing, reading, management of a file system, and management of bad pages. The RAM 44-2 operates in response to a control of the central processing unit 44-1 and is used as a working memory, a buffer memory, and a cache memory. When the RAM 44-2 is used as a working memory, data processed by the central processing unit 44-1 may be temporarily stored therein. Used as a buffer memory, the RAM 44-2 buffers data that is transferred from a host to the nonvolatile memory device 42 or from the nonvolatile memory device 42 to the host. As a cache memory, the RAM 44-2 enables a low-speed nonvolatile memory device 42 to operate at high speed.

The ECC block 44-3 generates an error correction code ECC for correcting a fail bit or an error bit of data received from the nonvolatile memory device 42. The ECC block 44-3 performs error correction encoding on data to be provided to the nonvolatile memory device 42, so parity information is added thereto. The parity information may be stored in the nonvolatile memory device 42. The ECC block 44-3 performs error correction decoding on data output from the nonvolatile memory device 42. The ECC block 44-3 corrects an error using the parity. The ECC block 44-3 corrects an error using LDPC (Low Density Parity Check) code, BCH code, turbo code, RS (Reed-Solomon) code, convolution code, RSC (Recursive Systematic Code), TCM (Trellis-Coded Modulation), BCM (Block Coded Modulation), and so on.

The memory controller 44 exchanges data with the host through the host interface 44-5 and with the nonvolatile memory device 42 through the NVM interface 44-6. The host interface 44-5 may be connected with a host via PATA (Parallel AT Attachment bus), SATA (Serial AT attachment bus), SCSI, USB, PCIe, NAND interface, and so on.

In exemplary embodiments, the memory controller 44 may be equipped with a wireless communication function (e.g., Wi-Fi).

The storage device 40 starts to perform word line biasing of an unselected block according to an external request, thereby improving integrity of data.

Figure 21:
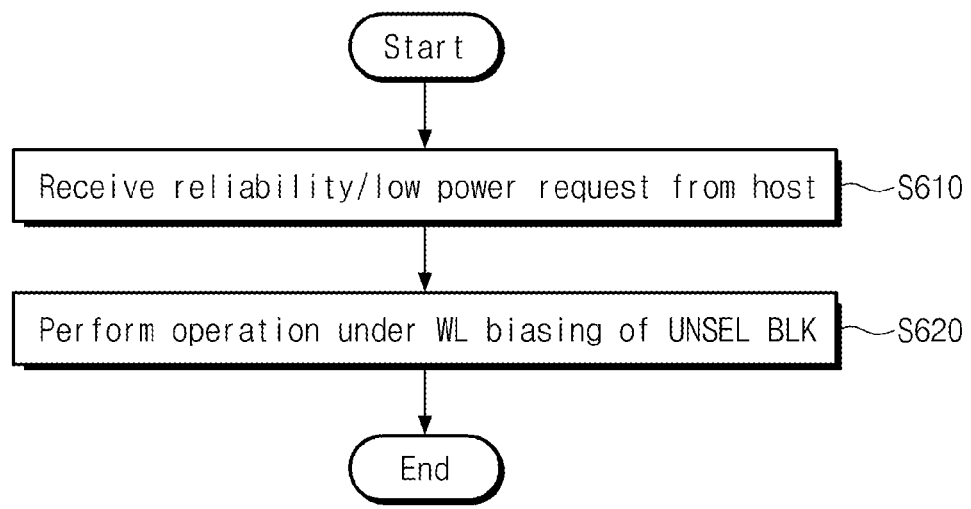
FIG. 21 is a flow chart showing an operating method of a memory system according to an embodiment of the inventive concept.

FIG. 21 is a flow chart showing an operating method of a memory system according to an embodiment of the inventive concept. Referring to FIGS. 20 and 21, in step S610, a reliability/low-power request is received from an external device. Word line biasing of an unselected block begins in response to the reliability/low-power request. In step S620, a program, a read, or an erase operation is performed at a word line biasing state about the unselected block.

The inventive concept is applicable to a solid state drive (SSD).

Figure 22:
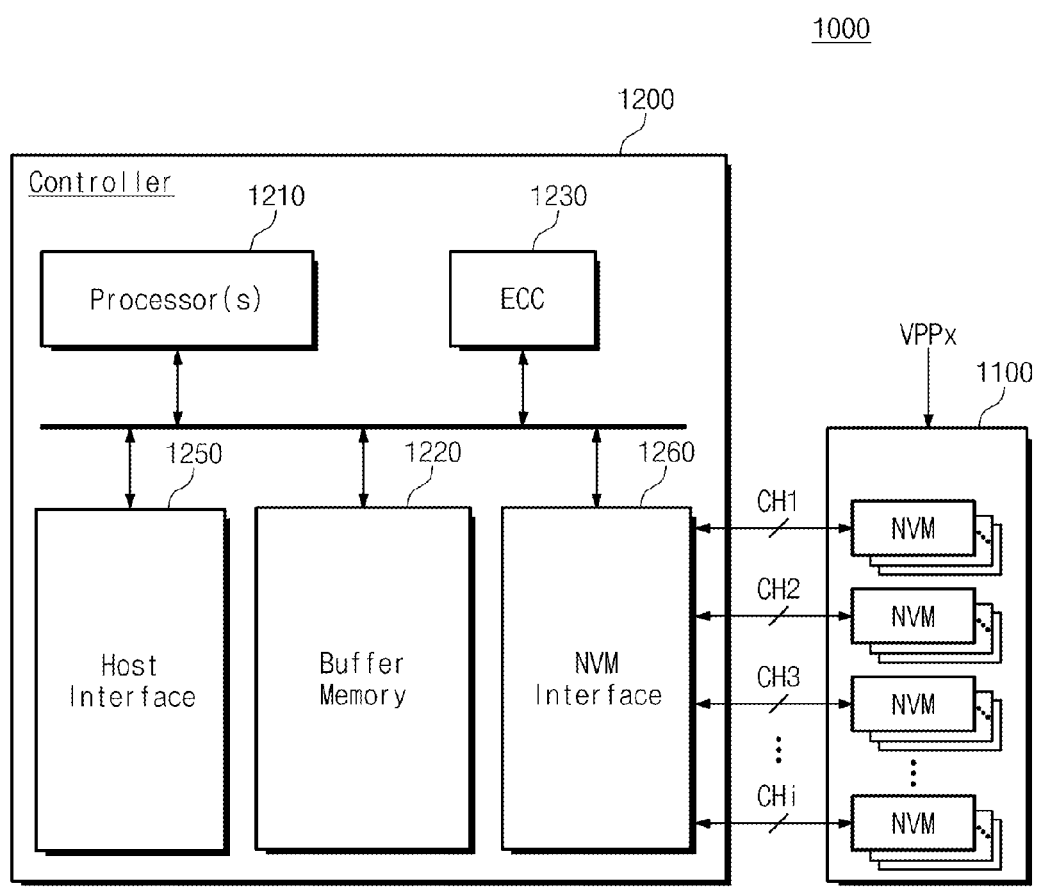
FIGS. 22 through 25, and FIGS. 26A-26C are diagrams showing applications of the inventive concept.

FIG. 22 is a block diagram schematically illustrating a solid state drive according to an embodiment of the inventive concept. Referring to FIG. 22, a solid state drive (SSD) 1000 includes a plurality of nonvolatile memory devices 1100 and an SSD controller 1200.

The nonvolatile memory devices 1100 are implemented to be provided with an external high voltage VPPx optionally. Each of the nonvolatile memory devices 1100 may be implemented with a nonvolatile memory device described with reference to FIGS. 1 through 21. The SSD controller 1200 is connected to the nonvolatile memory devices 1100 through a plurality of channels CH1 through CHi (i being an integer of 2 or more). The SSD controller 1200 may be implemented with a memory controller described with reference to FIGS. 1 through 21.

The SSD controller 1200 includes one or more processors 1210, a buffer memory 1220, an ECC block 1230, a host interface 1250, and a nonvolatile memory interface 1260.

The buffer memory 1220 temporarily stores data needed to drive the SSD controller 1200. In exemplary embodiments, the buffer memory 1220 may include a plurality of memory lines each of which stores data or a command. The memory lines may be mapped onto cache lines in various manners. The buffer memory 1220 may store page bitmap information and read count information. The page bitmap information and read count information may be read from the nonvolatile memory device 1100 and may be updated according to an internal operation. The updated page bitmap information and read count information may be stored at the nonvolatile memory device 1100 periodically or randomly.

The ECC block 1230 calculates an ECC value of data to be programmed at a write operation, corrects an error of read data according to an ECC value at a read operation, and corrects an error of data restored from the nonvolatile memory device 1100 at a data restoration operation. Although not shown in FIG. 22, a code memory may be further included to store code data needed to drive the SSD controller 1200. The code memory may be implemented with a nonvolatile memory device.

The host interface 1250 provides an interface with an external device. The host interface 1250 may be a NAND flash interface. In addition, the host interface 1250 may be implemented with various interfaces or with a plurality of interfaces. The nonvolatile memory interface 1260 provides an interface with the nonvolatile memory devices 1100.

The SSD 1000 operates at a word line biasing state about an unselected block, thereby markedly improving integrity of data.

The inventive concept is applicable to an Embedded Multimedia Card (eMMC) (e.g., moviNAND™, iNAND™, etc.).

Figure 23:
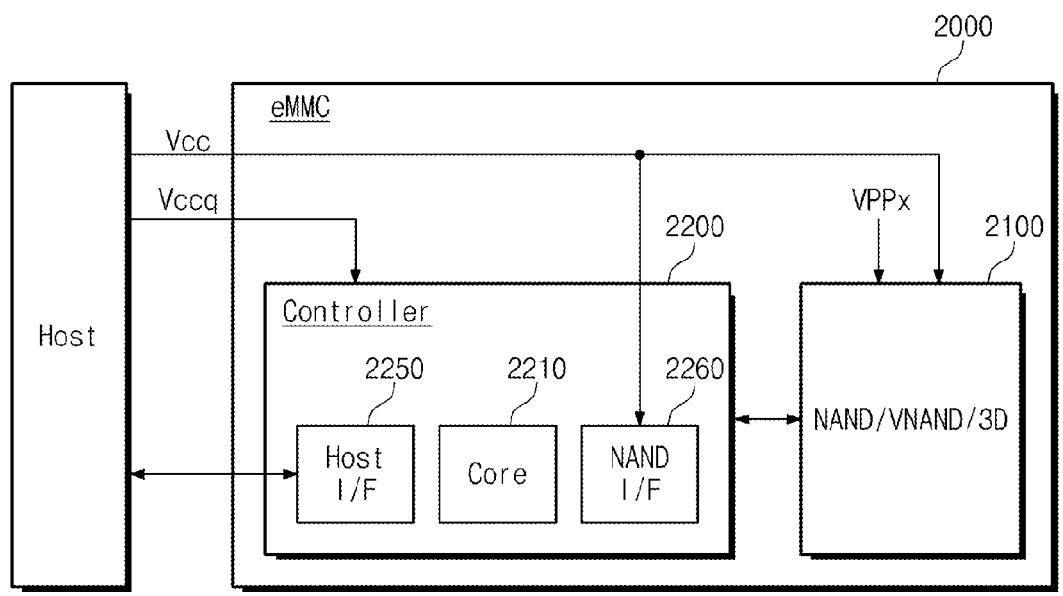

FIG. 23 is a block diagram schematically illustrating an Embedded Multimedia Card (eMMC) according to an embodiment of the inventive concept. Referring to FIG. 23, an eMMC 2000 includes one or more NAND flash memory devices 2100 and a controller 2200.

The NAND flash memory device 2100 may be implemented with a nonvolatile memory device described with reference to FIGS. 1 through 21. The controller 2200 is connected to the NAND flash memory device 2100 via a plurality of channels. The memory controller 2200 may be implemented with a memory controller 200 described with reference to FIGS. 1 through 21.

The controller 2200 includes one or more controller cores 2210, a host interface 2250, and a NAND interface 2260. The controller core 2210 may control an overall operation of the eMMC 2000. The host interface 2250 performs an interface between the controller 2200 and a host. The NAND interface 2260 provides an interface between the NAND flash memory device 2100 and the controller 2200. In exemplary embodiments, the host interface 2250 may be a parallel interface (e.g., MMC interface). In other exemplary embodiments, the host interface 2250 of the eMMC 2000 may be a serial interface (e.g., UHS-II, UFS interface, etc.). As another example, the host interface 2250 may be a NAND interface.

The eMMC 2000 receives power supply voltages Vcc and Vccq from the host. Herein, the power supply voltage Vcc (e.g., about 3.3 V) may be supplied to the NAND flash memory device 2100 and the NAND interface 2260, and the power supply voltage Vccq (e.g., about 1.8 V/3.3 V) may be supplied to the controller 2200. In exemplary embodiments, the eMMC 2000 may be optionally supplied with an external high voltage.

The eMMC 200 makes integrity of data better, thereby lowering error incidence. Thus, the eMMC 200 operates at high speed.

The inventive concept is applicable to Universal Flash Storage UFS.

Figure 24:
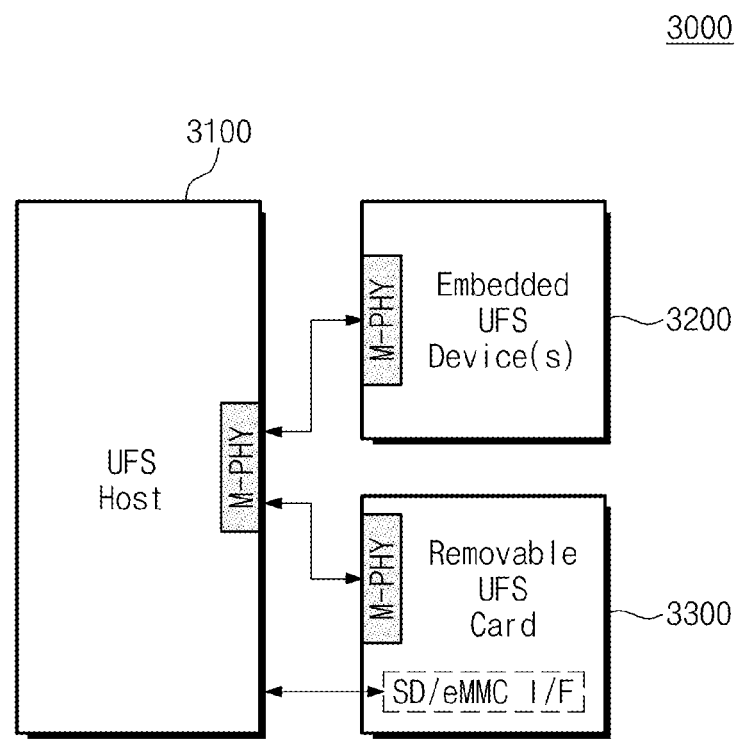

FIG. 24 is a block diagram schematically illustrating a Universal Flash Storage (UFS) system according to an embodiment of the inventive concept. Referring to FIG. 24, a UFS system 3000 includes a UFS host 3100, an embedded UFS device 3200, and a removable UFS card 3300. Communication between the UFS host 3100 and the embedded UFS device 3200 and communication between the UFS host 3100 and the removable UFS card 3300 may be performed through M-PHY layers.

At least one of the embedded UFS device 3200 and the removable UFS card 3300 may be implemented with a storage device 10 described with reference to FIG. 17, a storage device 20 described with reference to FIG. 18, or a memory system 40 described with reference to FIG. 20.

Meanwhile, the host 3100 includes a bridge that enables the removable UFS card 3300 to communicate using the protocol different from the UFS protocol. The UFS host 3100 and the removable UFS card 3300 may communicate through various card protocols (e.g., UFDs, MMC, SD (secure digital), mini SD, Micro SD, etc.).

The inventive concept is applicable to a mobile device.

Figure 25:
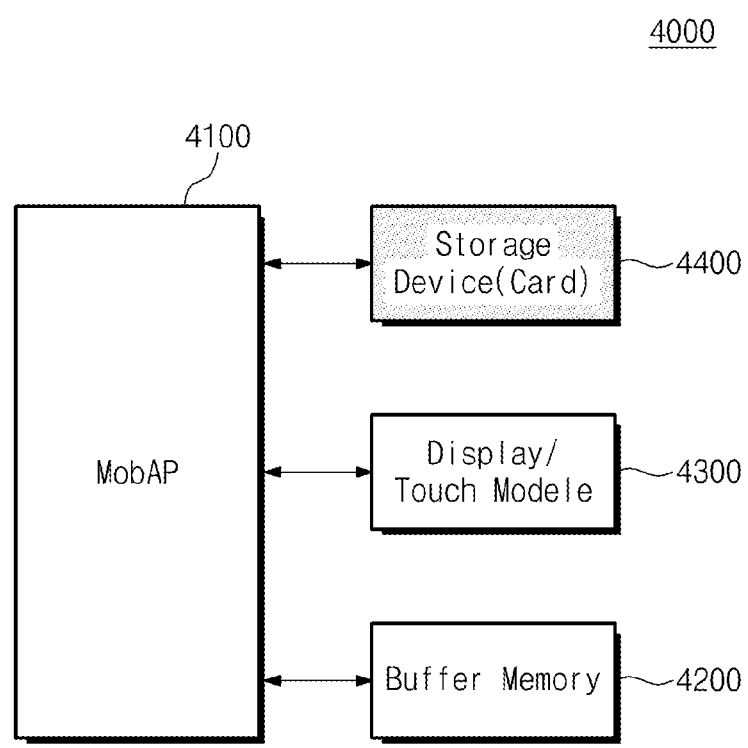

FIG. 25 is a block diagram schematically illustrating a mobile device 4000 according to an embodiment of the inventive concept. Referring to FIG. 25, a mobile device 4000 includes an integrated processor (ModAP™) 4100, a buffer memory 4200, a display/touch module 4300, and a storage device 4400.

The integrated processor 4100 controls an overall operation of the mobile device 4000 and wireless/wire communications with an external device. The buffer memory 4200 stores data needed to perform a processing operation of the mobile device 4000. The display/touch module 4300 is implemented to display data processed by the integrated processor 4100 or to receive data through a touch panel. The storage device 4400 is implemented to store user data. The storage device 4400 may be, but not limited to, a memory card, an eMMC, an SSD, or an UFS device. The storage device 4400 may be implemented with a storage device 10 described with reference to FIG. 17, a storage device 20 described with reference to FIG. 18, or a memory system 40 described with reference to FIG. 20.

The mobile device 400 includes the storage device 4400 that operates at a word line biasing state about an unselected block, thereby improving data integrity.

Figure 26A:
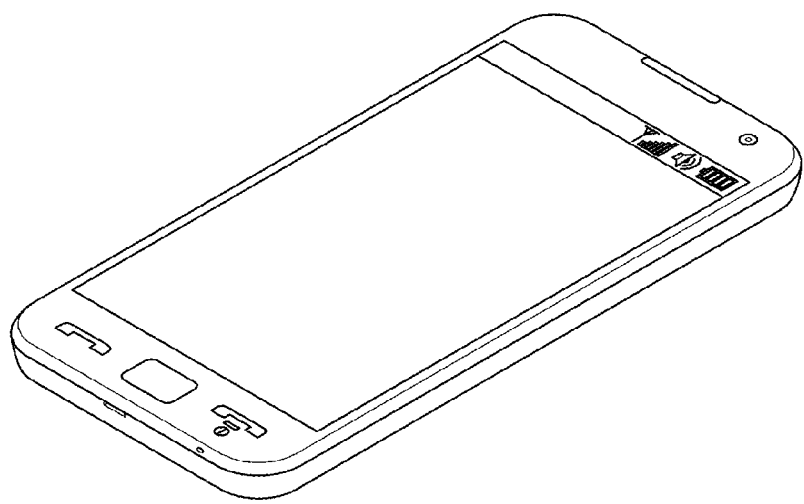
Figure 26B:
Figure 26C:
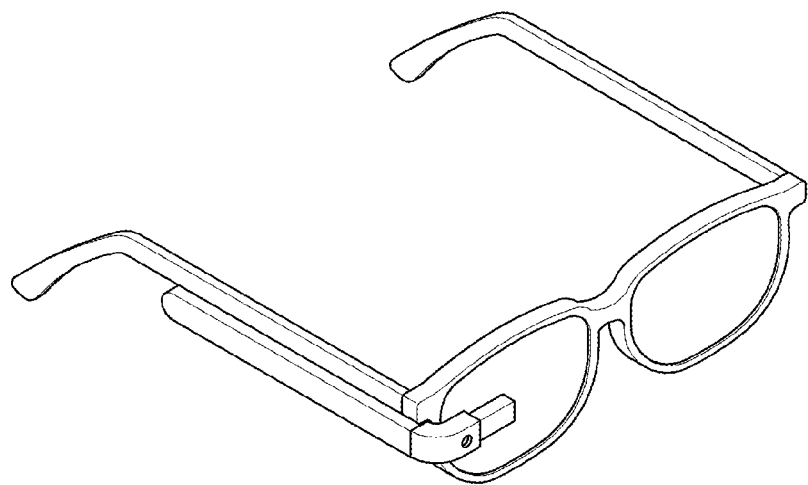

The above-described mobile device 4000 may be applied to a variety of electronic devices, such as a smart phone, a wearable watch, and a smart glass, as illustrated in FIGS. 26A, 26B, and 26C.

A memory system or a storage device according to the inventive concept may be packaged according to any of a variety of different packaging technologies. Examples of such packaging technologies may include the following: PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A nonvolatile memory device, comprising:
a plurality of memory blocks including a first memory block and a second memory block, each of the plurality of memory blocks including a plurality of memory cell strings, each of the plurality of memory cell strings including a ground selection transistor and a plurality of nonvolatile memory cells that are connected in series and stacked over a substrate in a direction that is perpendicular to the substrate, each of the plurality of memory blocks having a floating body structure;
a plurality of word lines including a first group of word lines and a second group of word lines, the first group of word lines being connected to the first memory block, the second group of word lines being connected to the second memory block; and
a source driver configured to apply a plurality of operation voltages needed for a read or program operation to the first group of word lines and to apply a plurality of unselected block word line voltages higher than a ground voltage to the second group of word lines during the read or program operation,
wherein the ground selection transistor of each of the plurality of memory cell strings of the second memory block is turned off and channels of the plurality of memory cell strings of the second memory block are electrically disconnected from the substrate while the source driver applies the plurality of unselected block word line voltages to the second group of word lines.

2. The nonvolatile memory device of claim 1, wherein the plurality of unselected block word line voltages are determined based on a temperature of the nonvolatile memory device.

3. The nonvolatile memory device of claim 1, wherein the plurality of operation voltages are a plurality of read pass voltages or a plurality of program pass voltages.

4. The nonvolatile memory device of claim 1, wherein the plurality of unselected block word line voltages are higher than a power supply voltage.

5. The nonvolatile memory device of claim 1, further including a block address decoder shared by the first memory block and the second memory block and configured to connect the source driver to both the first group of word lines and the second group of word lines.

6. The nonvolatile memory device of claim 1, wherein each of the plurality of unselected block word line voltages is determined according to a corresponding zone among a plurality of zones of the second group of word lines.

7. A nonvolatile memory device, comprising:
   a plurality of memory blocks including a first memory block, a second memory block and a third memory block, each of the plurality of memory blocks including a plurality of memory cell strings, each of the plurality of memory cell strings including a ground selection transistor and a plurality of nonvolatile memory cells that are connected in series and stacked over a substrate in a direction that is perpendicular to the substrate, each of the plurality of memory blocks having a floating body structure;
   a plurality of word lines including a first group of word lines, a second group of word lines and a third group of word lines that are connected to the first memory block, the second memory block and the third memory block, respectively;
   a source driver configured to apply a plurality of operation voltages needed for a read or program operation to the first group of word lines and to apply a plurality of unselected block word line voltages higher than a ground voltage to the second group of word lines during the read or program operation,
   wherein the third group of word lines are floated during the read or program operation,
   the ground selection transistor of each of the plurality of memory cell strings of the second memory block is turned off and channels of the plurality of memory cell strings of the second memory block are electrically disconnected from the substrate while the source driver applies the plurality of unselected block word line voltages to the second group of word lines, and
   the plurality of unselected block word line voltages are determined based on a temperature of the nonvolatile memory device.

8. The nonvolatile memory device of claim 7, wherein the plurality of unselected block word line voltages are higher than a power supply voltage.

9. The nonvolatile memory device of claim 7, further including:
   a plurality of pass transistors including a first group of pass transistors, a second group of pass transistors and a third group of pass transistors that are connected to the first group of word lines, the second group of word lines and the third group of word lines, respectively; and
   a plurality of block address decoders including a first block address decoder and a second block address decoder, the first block address decoder being shared by the first memory block and the second memory block, the first block address decoder being configured to control the first group of pass transistors and the second group of pass transistors, the second block address decoder being configured to control the third group of pass transistors,
   wherein the source driver applies the plurality of operation voltages to the first group of word lines through the first group of pass transistors and applies the plurality of unselected block word line voltages to the second group of word lines through the second group of pass transistors while the first block address decoder concurrently turns on the first group of pass transistors and the second group of pass transistors, and
   the second block address decoder causes the third group of word lines to be floated by turning off the third group of pass transistors.

10. The nonvolatile memory device of claim 9, wherein voltages of the floated third group of word lines are coupled up to a plurality of specific voltages by a coupling between the floated third group of word lines and channels of the plurality of memory cell strings of the third memory block.

11. The nonvolatile memory device of claim 10, wherein the plurality of unselected block word line voltages are higher than the plurality of specific voltages.

12. The nonvolatile memory device of claim 7, wherein each of the plurality of unselected block word line voltages is determined according to a corresponding zone among a plurality of zones of the second group of word lines.

* * * * *